(12) United States Patent
Bai

(10) Patent No.: US 10,651,875 B2
(45) Date of Patent: May 12, 2020

(54) MULTI-WAY SWITCH, RADIO FREQUENCY SYSTEM, AND WIRELESS COMMUNICATION DEVICE

(71) Applicant: Guangdong Oppo Mobile Telecommunications Corp., Ltd., Dongguan, Guangdong (CN)

(72) Inventor: Jian Bai, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 0 days.

(21) Appl. No.: 16/203,573

(22) Filed: Nov. 28, 2018

(65) Prior Publication Data
US 2019/0288717 A1 Sep. 19, 2019

(30) Foreign Application Priority Data

Mar. 16, 2018 (CN) .......................... 2018 1 0220712

(51) Int. Cl.
*H04B 1/00* (2006.01)
*H01Q 1/24* (2006.01)
(Continued)

(52) U.S. Cl.
CPC ............. *H04B 1/006* (2013.01); *H01Q 1/243* (2013.01); *H01Q 9/0442* (2013.01);
(Continued)

(58) Field of Classification Search
CPC ...... H04B 1/006; H01Q 1/243; H01Q 9/0442; H03F 2200/294; H03F 1/0277; H04M 1/24; H04L 5/08
See application file for complete search history.

(56) References Cited

U.S. PATENT DOCUMENTS

| | | | |
|---|---|---|---|
| 9,385,795 B1 * | 7/2016 | Ananthanarayanan | ... H04L 5/08 |
| 2009/0054093 A1 | 2/2009 | Kim et al. | |

(Continued)

FOREIGN PATENT DOCUMENTS

| | | |
|---|---|---|
| CN | 101867402 A | 10/2010 |
| CN | 103905104 A | 7/2014 |

(Continued)

OTHER PUBLICATIONS

International search report issued in corresponding international application No. PCT/CN2018/117728 dated Jan. 30, 2019.

(Continued)

*Primary Examiner* — Charles N Appiah
*Assistant Examiner* — Xiang Zhang
(74) *Attorney, Agent, or Firm* — Young Basile Hanlon & MacFarlane, P.C.

(57) ABSTRACT

A multi-way switch, a radio frequency system, and a wireless communication device are provided. The multi-way switch includes five T ports and four P ports, and the five T ports include two first T ports being coupled with all of the four P ports. The multi-way switch is configured to be coupled with a radio frequency circuit and an antenna system of a wireless communication device. The wireless communication device is operable in a dual-frequency single-transmit mode. The antenna system includes four antennas corresponding to the four P ports.

17 Claims, 15 Drawing Sheets

(51) Int. Cl.
*H01Q 9/04* (2006.01)
*H03F 1/02* (2006.01)
*H03F 3/189* (2006.01)
*H04B 1/44* (2006.01)
*H04B 1/04* (2006.01)

(52) U.S. Cl.
CPC ........... *H03F 1/0277* (2013.01); *H03F 3/189* (2013.01); *H04B 1/44* (2013.01); *H03F 2200/294* (2013.01); *H04B 2001/0408* (2013.01)

(56) References Cited

U.S. PATENT DOCUMENTS

| | | | |
|---|---|---|---|
| 2012/0326942 A1* | 12/2012 | Simmons | H01Q 3/242 343/876 |
| 2013/0308554 A1 | 11/2013 | Ngai et al. | |
| 2014/0169243 A1* | 6/2014 | Khlat | H04B 7/0602 370/297 |
| 2014/0187284 A1* | 7/2014 | Sanchez | H04B 7/0814 455/550.1 |
| 2014/0227982 A1 | 8/2014 | Granger-Jones et al. | |
| 2017/0195004 A1 | 7/2017 | Cheng et al. | |
| 2018/0145742 A1* | 5/2018 | Li | H04B 7/0404 |
| 2019/0140706 A1* | 5/2019 | Chang | H04B 7/0413 |

FOREIGN PATENT DOCUMENTS

| | | |
|---|---|---|
| CN | 105245295 A | 1/2016 |
| CN | 106450796 A | 2/2017 |
| CN | 106559277 A | 4/2017 |
| CN | 106685621 A | 5/2017 |
| CN | 108199730 A | 6/2018 |
| CN | 108390694 A | 8/2018 |
| CN | 108462507 A | 8/2018 |
| WO | 2012026601 A1 | 3/2012 |
| WO | 2012109988 A1 | 8/2012 |
| WO | 2015131020 A1 | 9/2015 |

OTHER PUBLICATIONS

Extended European search report issued in corresponding European application No. 18209410.2 dated May 28, 2019.

Gao Xiang et al: "Multi-Switch for Antenna Selection in Massive MIMO" 2015 IEEE Global Communications Conference (GLOBECOM), IEEE, Dec. 6, 2015 (Dec. 6, 2015), pp. 1-6, XPQ32872922, DOI: 10.1109/GLOCOM.2014.7417765; abstract; Sections I, III.B, III.C; figures 1, 2, 5, 6.

Lemieux G et al: "Generating Highly-Routable Sparse Crossbars for PLDS" FPGA'00. ACM/SIGDA International Symposium on Field Programmable Gate Arrays. Monterey, CA, Feb. 9-11, 20; [ACM/SIGDA International Symposium on Field Programmable Gate Arrays], New York, NY: ACM, US, vol: Conf. 8, Jan. 1, 2000 (Jan. 1, 2000), pp. 155-164, XP008O6O160, DOI: 10.1145/329166.329199; ISBN: 978-1-58113-193-2; Section 2; figure 1.

* cited by examiner

MULTI-WAY SWITCH, RADIO FREQUENCY SYSTEM, AND WIRELESS COMMUNICATION DEVICE

CROSS-REFERENCE TO RELATED APPLICATION(S)

This application claims priority to Chinese Patent Application No. 201810220712.2, filed on Mar. 16, 2018, the entire disclosure of which is hereby incorporated by reference.

TECHNICAL FIELD

This disclosure relates to the field of mobile terminal technology, and particularly to a multi-way switch, a radio frequency system, and a wireless communication device.

BACKGROUND

With the widespread use of electronic devices such as smart phones, the smart phone can support an increasing number of applications and is becoming more and more powerful. The smart phone is developing in a diversified and personalized way, becoming an indispensable electronic product in users' life. In the fourth generation (4G) mobile communication system, the electronic device generally adopts a single-antenna or dual-antenna radio frequency (RF) system architecture. Currently, in a new radio (NR) system of the fifth generation (5G) mobile communication system, an electronic device supporting a four-antenna RF system architecture is proposed.

SUMMARY

Implementations of the disclosure provide a multi-way switch, a radio frequency system, and a wireless communication device, to implement a function of transmitting a sounding reference signals (SRS) through four antennas corresponding to four ports in turn (that is, four-port SRS) of a wireless communication device in the fifth generation new radio (5G NR).

According to a first aspect of implementations of the disclosure, a multi-way switch is provided. The multi-way switch includes five T ports and four P ports, and the five T ports include two first T ports coupled with all of the four P ports. The multi-way switch is configured to be coupled with a radio frequency circuit and an antenna system of a wireless communication device. The wireless communication device is operable in a dual-frequency single-transmit mode. The antenna system includes four antennas corresponding to the four P ports.

According to a second aspect of implementations of the disclosure, a radio frequency system is provided. The radio frequency system includes an antenna system, a radio frequency circuit, and a multi-way switch coupled with the radio frequency circuit and the antenna system of a wireless communication device. The multi-way switch includes five T ports and four P ports, and the five T ports include two first T ports coupled with all of the four P ports. The wireless communication device is operable in a dual-frequency single-transmit mode. The antenna system includes four antennas corresponding to the four P ports. The multi-way switch is configured to implement a preset function of the wireless communication device and the preset function is a function of transmitting the SRS through the four antennas in turn.

According to a third aspect of implementations of the disclosure, a wireless communication device is provided. The wireless communication device includes an antenna system, a radio frequency transmitter, a radio frequency circuit coupled with the radio frequency transmitter, and a multi-way switch coupled with the radio frequency circuit and the antenna system. The multi-way switch includes five T ports and four P ports, and the five T ports include two first T ports coupled with all of the four P ports. The wireless communication device is operable in a dual-frequency single-transmit mode. The antenna system includes four antennas corresponding to the four P ports. The multi-way switch is configured to implement a preset function of transmitting the SRS through the four antennas in turn.

In the implementations of the disclosure, the wireless communication device includes the antenna system, the radio frequency circuit, and the multi-way switch. The wireless communication device is operable in a dual-frequency single-transmit mode. The antenna system includes the four antennas. The multi-way switch includes five T ports and the four P ports. The multi-way switch is configured to be coupled with the radio frequency circuit and the antenna system, to implement the preset function of transmitting the SRS through the four antennas corresponding to the four P ports in turn.

BRIEF DESCRIPTION OF THE DRAWINGS

To describe technical solutions in implementations of the present disclosure or in the related art more clearly, the following briefly introduces the accompanying drawings required for describing the implementations or the related art. Apparently, the accompanying drawings in the following description only illustrate some implementations of the present disclosure. Those of ordinary skill in the art may also obtain other drawings based on these accompanying drawings without creative efforts.

DETAILED DESCRIPTION

Figure 1:
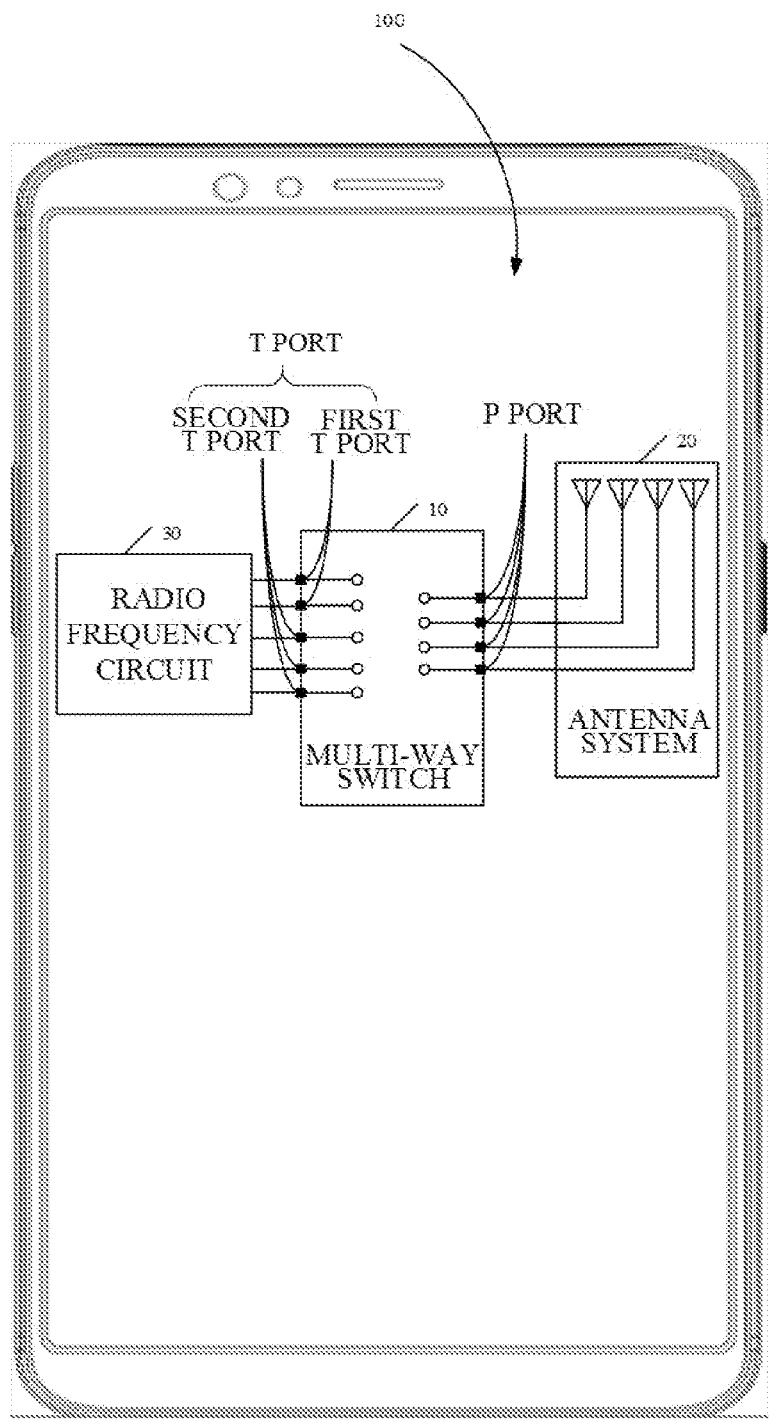
FIG. 1 is a schematic structural diagram illustrating a multi-way switch according to an implementation of the disclosure.

Technical solutions in implementations of the present disclosure will be described clearly and completely hereinafter with reference to the accompanying drawings described in the previous chapter. Apparently, the described implementations are merely some rather than all implementations of the present disclosure. All other implementations obtained by those of ordinary skill in the art based on the implementations of the present disclosure without creative efforts shall fall within the protection scope of the present disclosure.

The terms "first", "second", and the like used in the specification, the claims, and the accompany drawings of the present disclosure are to distinguish different objects rather than describe a particular order. The terms "include", "comprise", and "have" as well as variations thereof are intended to cover non-exclusive inclusion. For example, a process, system, product, or apparatus including a series of steps or units is not limited to the listed steps or units. Instead, it can optionally include other steps or units that are not listed; alternatively, other steps or units inherent to the process, product, or device can also be included.

The term "embodiment" or "implementation" referred to herein means that a particular feature, structure, or characteristic described in conjunction with the implementation may be contained in at least one implementation of the present disclosure. The phrase appearing in various places in the specification does not necessarily refer to the same implementation, nor does it refer to an independent or alternative implementation that is mutually exclusive with other implementations. It is explicitly and implicitly understood by those skilled in the art that an implementation described herein may be combined with other implementations.

The wireless communication device involved in the implementations of the present disclosure may include at least one of: an electronic device and a network device. The electronic device may include various handheld devices, in-vehicle devices, wearable devices, computing devices that have wireless communication functions or other processing devices connected to the wireless modem, as well as various forms of user equipments (UE) (such as, cellphones), mobile stations (MS), terminal devices, and the like. For the convenience of description, the above-mentioned devices are collectively referred to as an electronic device. The network device may include base stations, access points, etc.

Terms referred to herein will be given below.

Dual-frequency single-transmit mode: refer to an operating mode in which the wireless communication device can support dual frequency band-one uplink (UL) transmit path or dual frequency band-four downlink (DL) receive paths.

In the following implementations, an electronic device is described as an example of the wireless communication device.

At present, sounding reference signal (SRS) switching in four antennas of a mobile phone is a mandatory option for China mobile communications corporation (CMCC) in the China mobile fifth generation (5G) Scale Test Technical White Paper_Terminal, which is optional in the 3rd generation partnership project (3GPP). Its main purpose is for a base station to determine quality and parameters of four channels via measuring uplink signals of the four antennas of the mobile phone, to perform a beamforming of a downlink massive multi-input multi-output (MIMO) antenna array on the four channels according to a channel reciprocity, and finally to obtain the best data transmission performance for a downlink 4×4 MIMO. It should be noted that the 4×4 MIMO refers to that the base station has four antennas transmitting data and the terminal device has four antennas receiving data.

In order to satisfy requirements of SRS switching in four antennas, implementations of the present disclosure provide a radio frequency architecture based on a simplified 4P5T antenna switch. Compared with a 3P3T/DPDT/multi-way small switch switching scheme, the present switching scheme can reduce the number of series switches in each path (all or part of switches are integrated into the 4P5T switch), thereby reducing link loss and optimizing the overall transmission and reception performance of the terminal device. The implementations of the present disclosure are described in detail below.

FIG. 1 is a schematic structural diagram illustrating a multi-way switch according to an implementation of the disclosure. The multi-way switch 10 is applicable to an electronic device 100 including an antenna system 20 and a radio frequency circuit 30, the electronic device 100 is operable in a dual-frequency single-transmit mode, and the antenna system 20 includes four antennas. The multi-way switch 10 includes five T ports and four P ports, and the five T ports include two first T ports fully coupled with the four P ports. The multi-way switch 10 is configured to be coupled with the radio frequency circuit 30 and the antenna system 20 to implement a preset function of the electronic device 100, and the preset function is a function of transmitting a sounding reference signal (SRS) through the four antennas corresponding to the four P ports in turn.

The antenna refers to an antenna supporting a transmission function (that is, a signal transmission function) among the four antennas. The four antennas in the implementations of the present disclosure are capable of supporting the transmission function.

The electronic device may be a mobile phone or other terminal devices supporting the fifth generation new radio (5G NR), such as a customer premise equipment (CPE) or a mobile wireless-fidelity (MIFI).

Figure 3A:
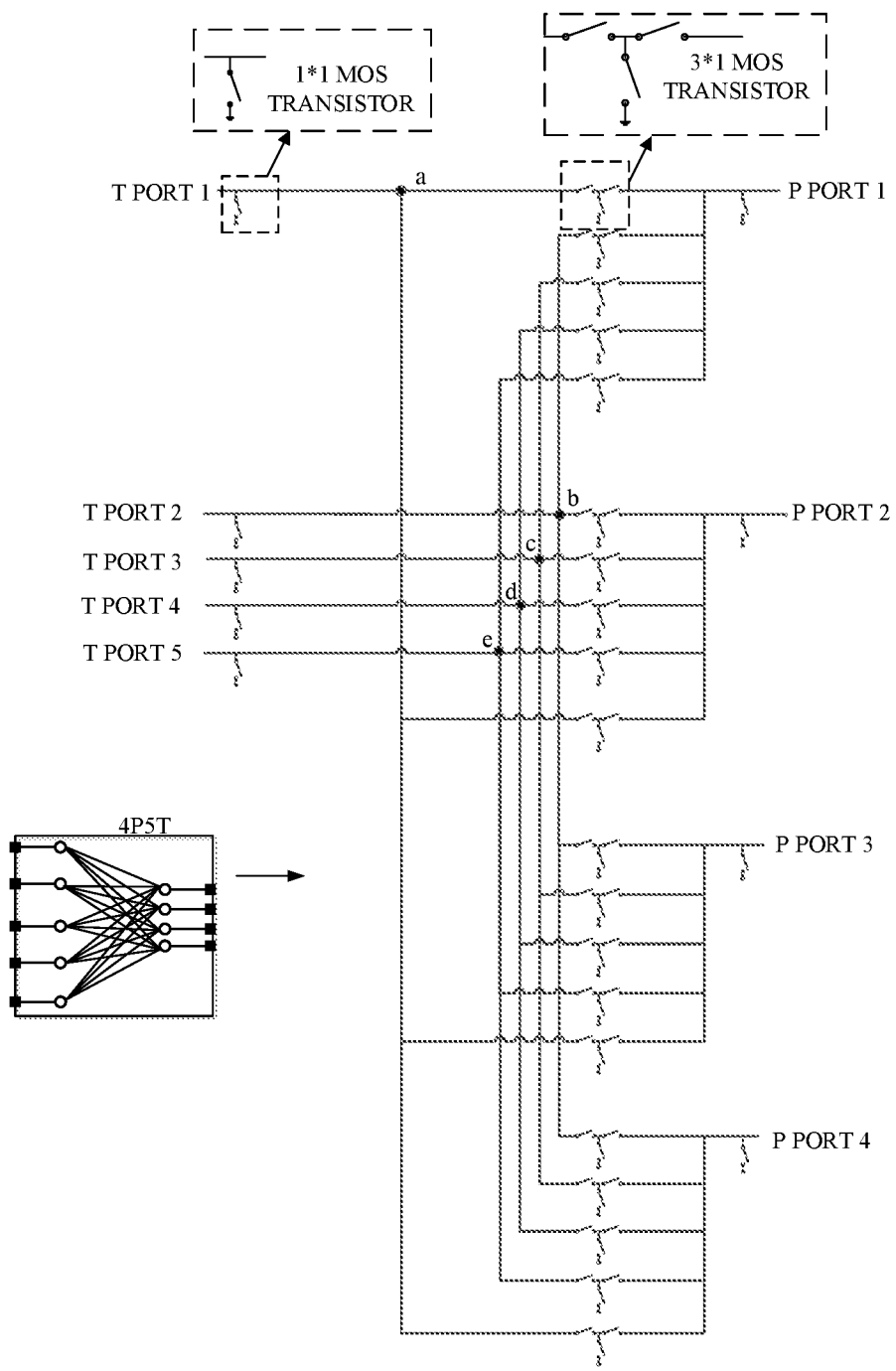
FIG. 3A is a schematic structural diagram illustrating a 4P5T switch with all T ports fully coupled with the four P ports according to an implementation of the disclosure.
Figure 3B:
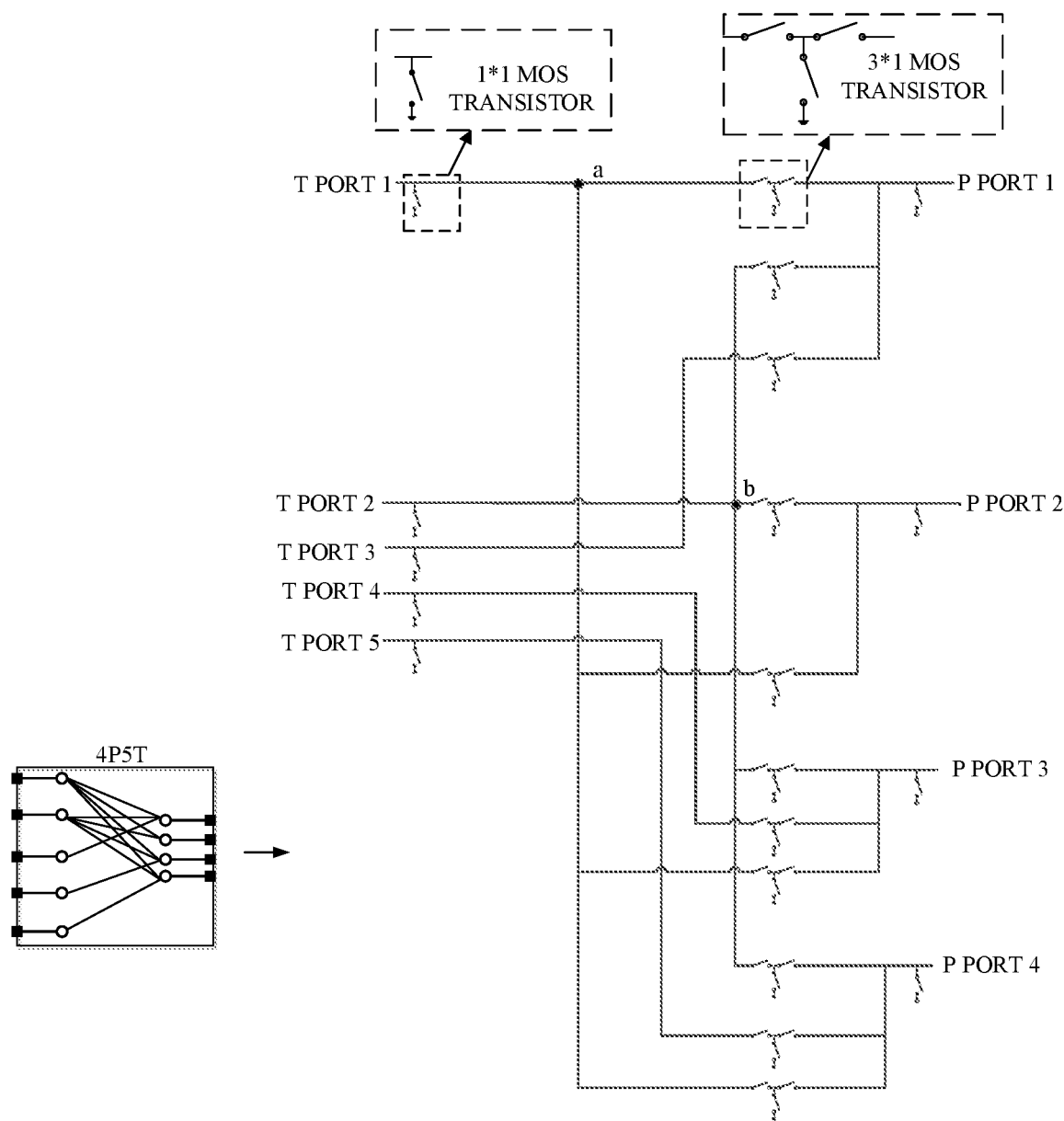
FIG. 3B is a schematic structural diagram illustrating a 4P5T simplified switch according to an implementation of the disclosure.

"P port" in the disclosure is the abbreviation of "pole port", which refers to ports coupled with antennas of the multi-way switch 10. "T port" in the disclosure is the abbreviation of "throw port", which refers to ports coupled with the radio frequency circuit 30 of the multi-way switch 10. In the implementations of the present disclosure, there are four P ports and five T ports. The multi-way switch 10 in the implementations of the present disclosure may also be referred to as a "4P5T switch" in order to facilitate the understanding of the structure of the multi-way switch 10. Specifically, as illustrated in FIG. 3A, T port 1 extends to the right via a first horizontal line and intersects with a first vertical line at a real point a, and then via the real point a, T port 1 is respectively coupled with P port 1, P port 2, P port 3, and P port 4. Corresponding, T port 2 extends to the right via a second horizontal line and intersects with a fifth vertical line at a real point b, and then via the real point b, T port 2 is respectively coupled with P port 1, P port 2, P port 3, and P port 4. T port 3 extends to the right via a third horizontal line and intersects with a fourth vertical line at a real point c, and then via the real point c, T port 3 is respectively coupled with P port 1, P port 2, P port 3, and P port 4. T port 4 extends to the right via a fourth horizontal line and intersects with a third vertical line at a real point d, and then via the real point d, T port 4 is respectively coupled with P port 1, P port 2, P port 3, and P port 4. T port 5 extends to the right via a fifth horizontal line and intersects with a second vertical line at a real point e, and then via the real point e, T port 5 is respectively coupled with P port 1, P port 2, P port 3, and P port 4. As illustrated in FIG. 3B, T port 1 extends to the right via a first horizontal line and intersects with a first vertical line at a real point a, and then via the real point a, T port 1 is respectively coupled with P port 1, P port 2, P port 3, and P port 4. Corresponding, T port 2 extends to the right via a second horizontal line and intersects with a fifth vertical line at a real point b, and then via the real point b, T port 2 is respectively coupled with P port 1, P port 2, P port 3, and P port 4.

In the implementations of the present disclosure, a T port is fully coupled with the four P ports, which means that the T port is coupled with all the P ports. For example, the first T port is a fully coupled port, that is, the first T port is coupled with all of the four P ports.

The expression of "transmitting the SRS through the four antennas corresponding to the four P ports in turn" refers to a process in which the electronic device 100 interacts with a base station based on polling mechanism to determine quality of an uplink channel corresponding to each antenna.

The multi-way switch of the implementations of the disclosure can enable the electronic device 100 to be operable in the dual-frequency dual-transmit mode. It is beneficial to simplify the RF architecture of the electronic device 100 supporting four-port SRS switching in the 5G NR, reduce the number of switches in transmit paths and receive paths, and reduce path loss, thereby improving transmit power/sensitivity, data transmission rate in the 5G NR, and uplink and downlink coverage of the mobile phone, and reducing power consumption.

In one implementation, the above-identified five T ports further include three second T ports, each of the three second T ports is coupled with one corresponding P port of the four P ports, and the three second T ports support reception at a first frequency band and a second frequency band, where the first frequency band does not overlap with the second frequency band. The three second T ports are coupled with different P ports. The four P ports are configured to be coupled in one-to-one correspondence with the four antennas. The two first T ports include one first T port supporting transmission and reception at the first frequency band and the other first T port supporting transmission and reception at the second frequency band.

In the implementations of the present disclosure, a T port is individually coupled with one corresponding P port of the four P ports, which means that the T port is only coupled with one corresponding P port of the four P ports. The three second T ports in the implementations of the present disclosure are all individually coupled ports, that is, each of the three second T ports is individually coupled with one corresponding P port of the four P ports.

The first frequency band and the second frequency band are frequency bands supporting the 5G NR. For ease of description, "NR Band Nx" represents the first frequency band supported by the electronic device 100 in the 5G NR. "NR Band Ny" represents the second frequency band supported by the electronic device 100 in the 5G NR. For example, the first frequency band may range from 3.3 GHz to 3.8 GHz, and the second frequency band may range from 4.4 GHz to 5 GHz. Alternatively, the first frequency band may range from 4.4 GHz to 5 GHz, and the second frequency band may range from 3.3 GHz to 3.8 GHz.

Figure 2:
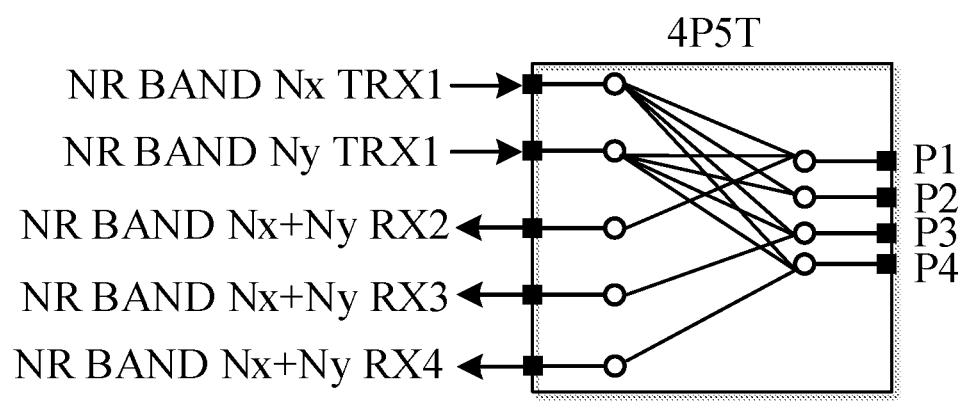
FIG. 2 is a schematic structural diagram illustrating a 4P5T switch according to an implementation of the disclosure.

The five T ports in the implementations of the present disclosure include two types of ports. The two first T ports (one first T port supporting transmission and reception at the first frequency band and the other first T port supporting transmission and reception at the second frequency band) are defined as ports of a first type, and the three second T ports are defined as ports of a second type. The first T ports are the fully coupled ports, one first port is a port supporting transmission and reception at the first frequency band (NR Band Nx), and the other first T port is a port supporting transmission and reception at the second frequency band (NR Band Ny). The three second T ports are the individually coupled ports and support reception at the NR Band Nx and the NR Band Ny. FIG. 2 is a schematic structural diagram illustrating a 4P5T switch according to an implementation of the disclosure. As illustrated in FIG. 2, the two first T ports include the "NR Band Nx TRX1" port and the "NR Band Ny TRX1" port. The "NR Band Nx TRX1" port supports transmission and reception of radio frequency signals at the NR Band Nx. The "NR Band Ny TRX1" port supports transmission and reception of radio frequency signals at the NR Band Ny. The three second T ports include the "NR Band Nx+Ny RX2" port, the "NR Band Nx+Ny RX3" port, and the "NR Band Nx+Ny RX4" port. The four P ports include P1 port, P2 port, P3 port, and P4 port. The "NR Band Nx TRX1" port is coupled with the P1 port, P2 port, P3 port, and P4 port. The "NR Band Ny TRX1" port is coupled with the P1 port, P2 port, P3 port, and P4 port. The "NR Band Nx+Ny RX2" port, the "NR Band Nx+Ny RX3" port, and the "NR Band Nx+Ny RX4" port are ports supporting reception at NR Band Nx and NR Band Ny. In order to avoid co-channel interference, the "NR Band Nx+Ny RX2" port, the "NR Band Nx+Ny RX3" port, and the "NR Band Nx+Ny RX4" port are coupled with different P ports. Referring to FIG. 2, the "NR Band Nx+Ny RX2" port is coupled with the P1 port, the "NR Band Nx+Ny RX3" port is coupled with the P3 port, and the "NR Band Nx+Ny RX4" port is coupled with the P4 port. It should be noted that the coupling manner of the second T ports and the P port illustrated in FIG. 2 is only one possible example, and any other coupling manners in which the three second T ports are coupled with different P ports are available.

The concept of "coupling", "individually coupled", "fully coupled", or other kinds of coupling between the T ports and the P ports of the multi-way switch 10 described in the implementations of the disclosure refers to a state in which the T ports are coupled with the P ports through first switch transistors. The first switch transistors are configured to control a unidirectional conduction between the T ports and the P ports (including a unidirectional conduction from the T ports to the P ports and a unidirectional conduction from the P ports to the T ports). The first switch transistor can be, for example, a switch array including three field-effect transistors (for example, metal-oxide-semiconductor (MOS) transistors). When the first switch transistor is disconnected and not grounded, parasitic parameters (such as parasitic capacitances and parasitic inductances) will greatly affect performance of other connected ports. Therefore, the first switch transistor is implemented with three MOS transistors. When the first switch transistor is disconnected, two MOS transistors at two ends are disconnected and one MOS transistor in the middle is grounded. In addition to the first switch transistor between the T port and the P port, the multi-way switch 10 further includes second switch transistors arranged beside the T ports and P ports. The second switch transistor can also be referred to as a grounding switch transistor. Each T port can be configured with a grounding switch transistor, and each P port can also be configured with a grounding switch transistor. When the T port or the P port does not perform signal transmission and reception, the grounding switch transistor configured therewith is turned on. When the T port or the P port receives or transmits signals, the grounding switch transistor configured therewith (that is, the second switch transistor) is turned off. The second switch transistor is configured to enable a corresponding port (T port or P port) and can be, for example, a MOS transistor. The specific configurations of the first switch transistor and the second switch transistor are not limited herein. As one implementation, the electronic device 100 can control paths between the T ports and the P ports to switch on through the first switch transistors. As one implementation, the electronic device 100 can be provided with a dedicated controller to be coupled with switch transistors of the multi-way switch 10.

As two of the five T ports is fully coupled with the four P ports and each of other T ports is only fixedly coupled with one antenna for receiving, the number of built-in field-effect transistors (FET), volume, and cost of the 4P5T switch can be reduced and performance can be improved. Details will be described hereinafter.

The multi-way switch includes field-effect transistors. For example, assuming that each of the five T ports is fully coupled with the four P ports; as illustrated in FIG. 3A, which is a schematic structural diagram of the multi-way switch, the number of the field-effect transistors of the multi-way switch is 5+5*4*3+4=69. In one implementation, only two T ports are fully coupled with the four P ports; as illustrated in FIG. 3B, which is a schematic structural diagram of the multi-way switch, the number of the field-effect transistors of the multi-way switch is 5+(2*4+(5−2)*1)*3+4=42. Obviously, according to the implementations of the present disclosure, the number of built-in FET, volume, and cost of the 4P5T switch can be reduced and performance can be improved.

Figure 4:
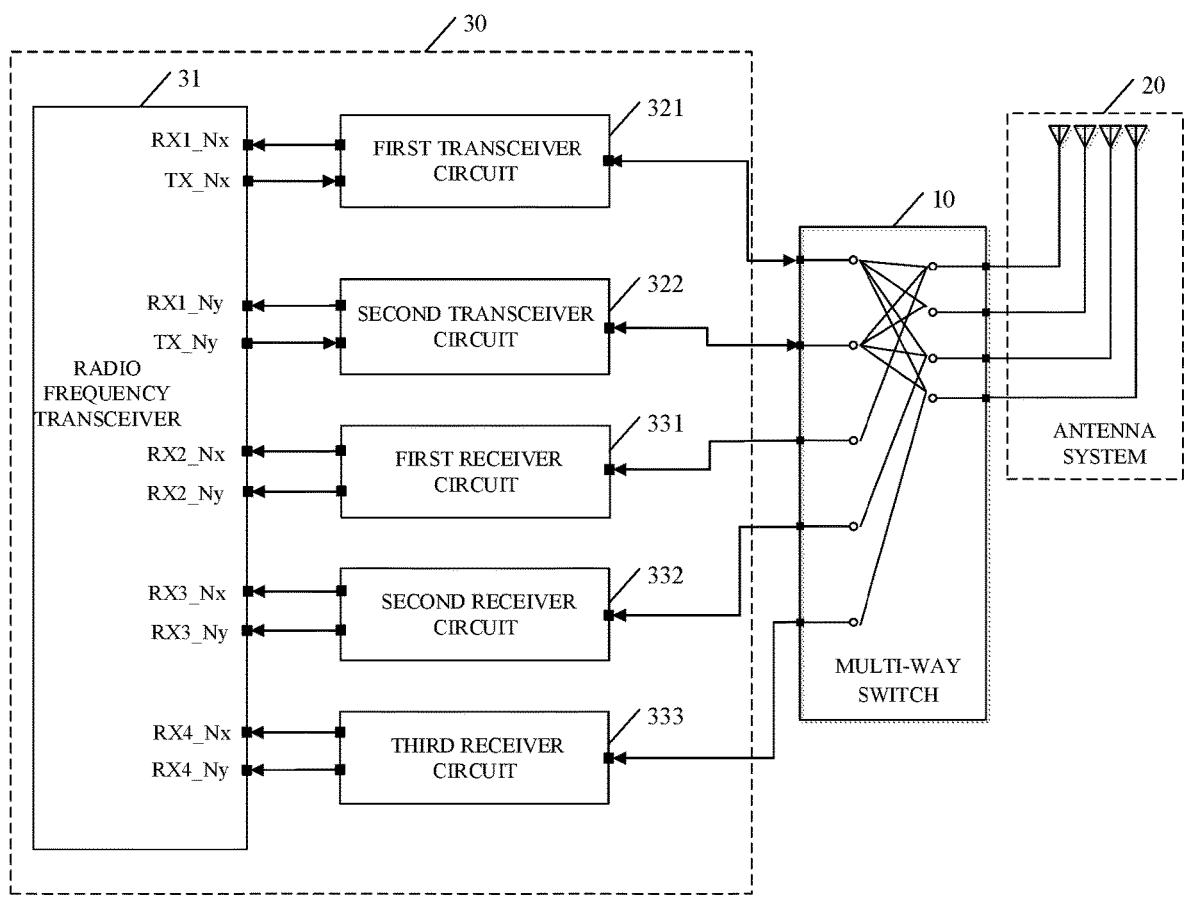
FIG. 4 is a schematic structural diagram illustrating a radio frequency circuit according to an implementation of the disclosure.
Figure 5:
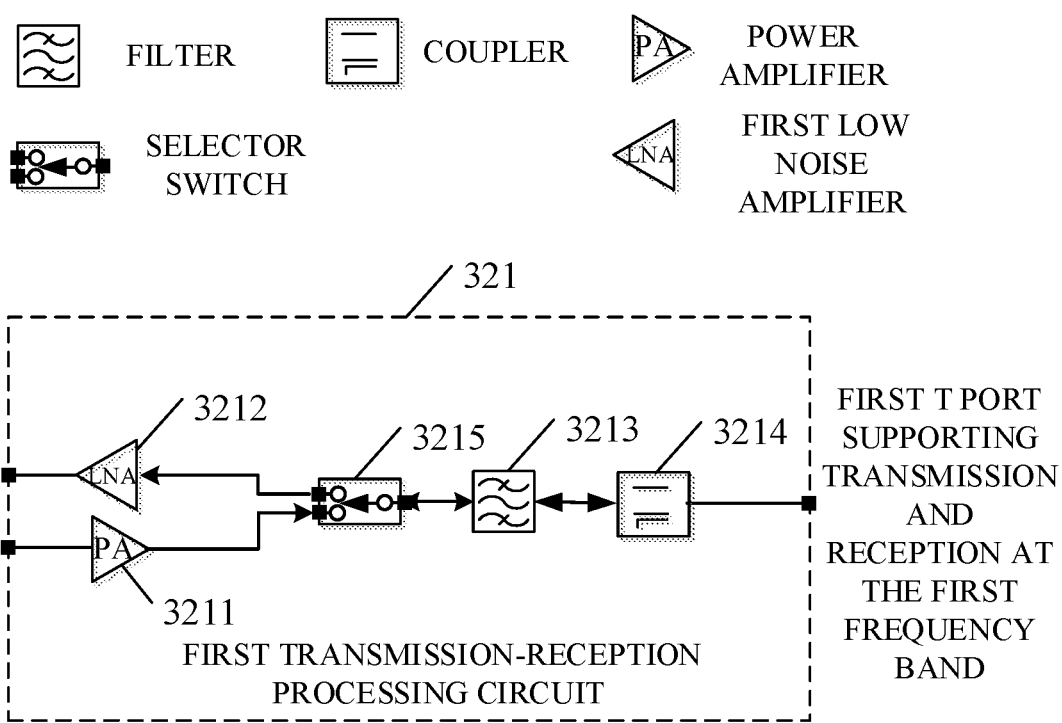
FIG. 5 is a schematic structural diagram illustrating a first transceiver circuit according to an implementation of the disclosure.
Figure 6:
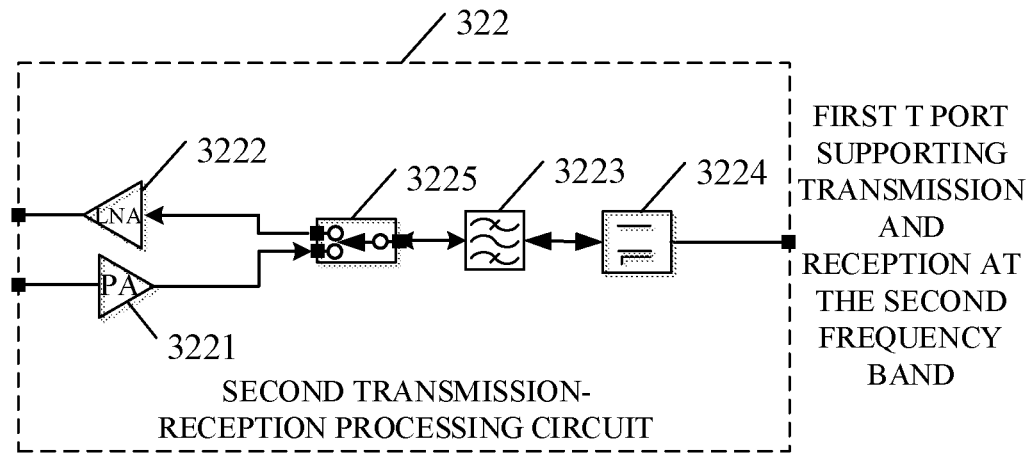
FIG. 6 is a schematic structural diagram illustrating a second transceiver circuit according to an implementation of the disclosure.
Figure 7:
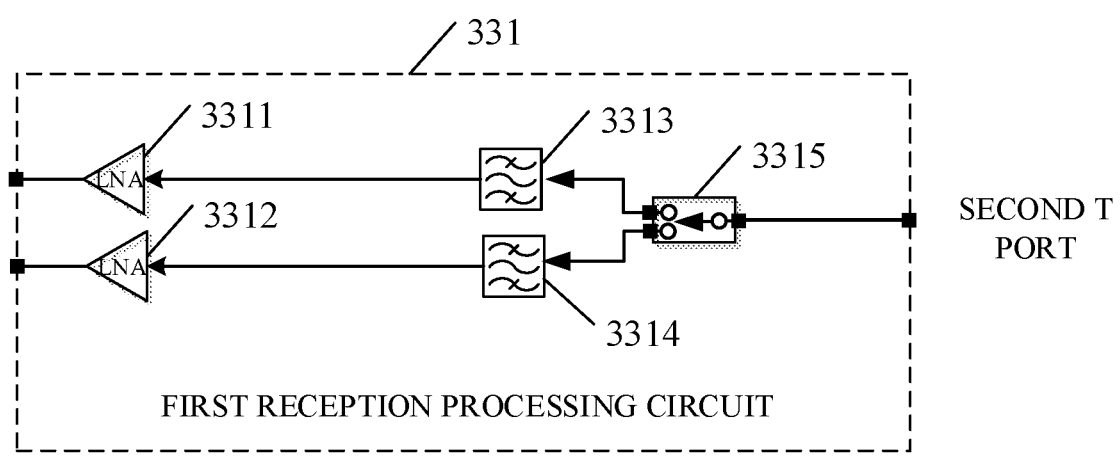
FIG. 7 is a schematic structural diagram illustrating a receiver circuit according to an implementation of the disclosure.

FIG. 4 is a schematic structural diagram illustrating a radio frequency circuit according to an implementation of the disclosure. As illustrated in FIG. 4, the radio frequency circuit 30 includes a radio frequency transceiver 31, a first transceiver circuit 321 (can be comprehended as a circuit for transmitting, receiving, and/or processing signals), a second transceiver circuit 322, and three receiver circuits (can be comprehended as a circuit for receiving and/or processing signals). It is to be noted that, "transmitting, receiving, and/or processing signals" of the disclosure means "transmitting, receiving, or processing signals" or "transmitting, receiving, and processing signals"; and "receiving and/or processing signals" means "receiving or processing signals" or "receiving and processing signals". The first transceiver circuit 321 includes a transmit path supporting transmission at the first frequency band (NR Band Nx) and a receive path supporting reception at the first frequency band (NR Band Nx) and coupled with the transmit path supporting transmission at the first frequency band (NR Band Nx), and the first transceiver circuit 321 is illustrated in FIG. 5. The second transceiver circuit 322 includes a transmit path supporting transmission at the second frequency band (NR Band Ny) and a receive path supporting reception at the second frequency band (NR Band Ny) and coupled with the transmit path supporting transmission at the second frequency band (NR Band Ny), and the second transceiver circuit 322 is illustrated in FIG. 6. The receiver circuit includes a first receive path supporting transmission at the first frequency band and a second receive path supporting reception at the second frequency band and coupled with the first receive path supporting transmission at the first frequency band, and the first receiver circuit is illustrated in FIG. 7.

As illustrated in FIG. 4, the three receiver circuits include a first receiver circuit 331, a second receiver circuit 332, and a third receiver circuit 333. The first receiver circuit 331, the second receiver circuit 332, and the third receiver circuit 333 are receiver circuits supporting signal processing at the NR Band Nx and the NR Band Ny.

In the implementations of the present disclosure, the radio frequency transceiver 31 is configured to transmit and receive radio frequency signals. On the uplink, the radio frequency transceiver 31 is configured to modulate baseband signals into radio frequency signals to be transmitted. The radio frequency signals are subjected to processing such as amplifying and filtering of the first transceiver circuit 321 or the second transceiver circuit 322, and are then converted into electromagnetic wave signals at a specific frequency band and transmitted via the antennas. On the downlink, the antennas receive the electromagnetic wave signals at the specific frequency band, and convert the electromagnetic wave signals into radio frequency signals. The radio frequency signals are subjected to processing such as amplifying and filtering and transmitted to the radio frequency transceiver 31. The radio frequency transceiver 31 is configured to demodulate the received radio frequency signals into baseband signals to be processed by a baseband chip.

In the implementations of the present disclosure, the first transceiver circuit 321 includes the transmit path supporting transmission at the first frequency band (NR Band Nx) and the receive path supporting reception at the first frequency band (NR Band Nx) and coupled with the transmit path supporting transmission at the first frequency band (NR Band Nx). The second transceiver circuit 322 includes the transmit path supporting transmission at the second frequency band (NR Band Ny) and the receive path supporting reception at the second frequency band (NR Band Ny) and coupled with the transmit path supporting transmission at the second frequency band (NR Band Ny). The first transceiver circuit 321 and the second transceiver circuit 322 each include one receive port, one transmit port, and one receive-transmit port. Each of the three receiver circuits includes one receive port and two transmit ports.

The multi-way switch 10 includes two first T ports and three second T ports. As illustrated in FIG. 4, each of the two first T ports is configured to be coupled with one corresponding receive-transmit port of the receive-transmit ports of the first transceiver circuit 321 and the second transceiver circuit 322. Each of the three second T ports is configured to be coupled with one corresponding receive port of the receive ports of the three receiver circuits.

The radio frequency transceiver 31 includes at least two transmit ports and eight receive ports to be adapted to the first transceiver circuit 321, the second transceiver circuit 322, and the three receiver circuits 331, 332, 333. As illustrated in FIG. 4, the radio frequency transceiver 31 includes two transmit ports including "TX_Nx" port and "TX_Ny" port, and eight receive ports including RX1_Nx port, RX1_Ny port, RX2_Nx port, RX2_Ny port, RX3_Nx port, RX3_Ny port, RX4_Nx port, RX4_Ny port. The "TX_Nx" port is coupled with the receive port of the first transceiver circuit 321. The "TX_Ny" is coupled with the receive port of the second transceiver circuit 322. The "RX1_Nx" port is coupled with the transmit port of the first transceiver circuit 321. The "RX1_Ny" port is coupled with the transmit port of the second transceiver circuit 322. The "RX2_Nx" port is coupled with a first transmit port of the first receiver circuit 331. The "RX2_Ny" port is coupled with a second transmit port of the first receiver circuit 331. The "RX3_Nx" port is coupled with a first transmit port of the second receiver circuit 332. The "RX3_Ny" port is coupled with a second transmit port of the second receiver circuit 332. The "RX4_Nx" port is coupled with a first transmit port of the third receiver circuit 333. The "RX4_Ny" port is coupled with a second transmit port of the third receiver circuit 333.

The specific structure of the transceiver circuit is illustrated in FIG. 5 and FIG. 6. FIG. 5 is a schematic structural diagram illustrating a first transceiver circuit according to an implementation of the disclosure. As illustrated in FIG. 5, the first transceiver circuit 321 includes a first power amplifier 3211 operable at the first frequency band (NR Band Nx), a first low noise amplifier 3212 operable at the first frequency band, a first filter 3213 allowing the first frequency band to pass through, a first coupler 3214, and a first selector switch 3215. The first power amplifier 3211 has an input port coupled with a corresponding transmit port TX_Nx of the radio frequency transceiver 31 and an output port coupled with a first fixed port of the first selector switch 3215. The first low noise amplifier 3212 has an output port coupled with a corresponding receive port RX1_Nx of the radio frequency transceiver 31 and an input port coupled with a second fixed port of the first selector switch 3215. The first filter 3213 has a first port coupled with a selector port of the first selector switch 3215 and a second port coupled with a first port of the first coupler 3214. The first coupler 3214 has a second port configured to be coupled with the first T port supporting transmission and reception at the first frequency band.

The first power amplifier 3211 is a radio frequency power amplifier for amplifying the radio frequency signals transmitted by the radio frequency transceiver 31. The first power amplifier 3211 can amplify the radio frequency signals at the first frequency band.

The first filter 3213 may filter the radio frequency signals amplified by the first power amplifier 3211, or filter the radio frequency signals received from the first T port supporting transmission and reception at the first frequency band. The first filter 3213 allows only the radio frequency signals at the first frequency band to pass through.

The first coupler 3214 is configured to couple two radio frequency signals and to output the two radio frequency signals coupled. In one implementation, the first coupler 3214 further has a power distribution function, and is configured to distribute input signal power to corresponding receive ports of the radio frequency transceiver 31, thereby facilitating the radio frequency transceiver 31 to adjust the power of the radio frequency signals transmitted therefrom.

The first selector switch 3215 may be a single-pole double-throw (SPDT) switch. When the selector port of the first selector switch 3215 is coupled with the first fixed port of the first selector switch 3215, the first power amplifier 3211, the first filter 3213, and the first coupler 3214 of the first transceiver circuit 321 are operable to form a transmit path, and in this case, the first transceiver circuit 321 is configured to process uplink signals. When the selector port of the first selector switch 3215 is coupled with the second fixed port of the first selector switch 3215, the first low noise amplifier 3212, the first filter 3213, and the first coupler 3214 of the first transceiver circuit 321 are operable to form a receive path, and in this case, the first transceiver circuit 321 is configured to process downlink signals.

FIG. 6 is a schematic structural diagram illustrating a second transceiver circuit according to an implementation of the disclosure. As illustrated in FIG. 6, the second transceiver circuit 322 includes a second power amplifier 3221 operable at the second frequency band (NR Band Ny), a second low noise amplifier 3222 operable at the second frequency band (NR Band Ny), a second filter 3223 allowing the second frequency band (NR Band Ny) to pass through, a second coupler 3224, and a second selector switch 3225. The second power amplifier 3221 has an input port coupled with a corresponding transmit port TX_Ny of the radio frequency transceiver 31 and an output port coupled with a first fixed port of the second selector switch 3225. The second low noise amplifier 3222 has an output port coupled with a corresponding receive port RX1_Ny of the radio frequency transceiver 31 and an input port coupled with a second fixed port of the second selector switch 3225. The second filter 3223 has a first port coupled with a selector port of the second selector switch 3225 and a second port coupled with a first port of the second coupler 3224. The second coupler 3224 has a second port configured to be coupled with the first T port supporting transmission and reception at the second frequency band.

The second power amplifier 3221 is a radio frequency power amplifier for amplifying the radio frequency signals transmitted by the radio frequency transceiver 31. The second power amplifier 3221 can amplify the radio frequency signals at the second frequency band.

The second filter 3223 may filter the radio frequency signals amplified by the second power amplifier 3221, or filter the radio frequency signals received from the first T port supporting transmission and reception at the second frequency band. The second filter 3223 allows only the radio frequency signals at the second frequency band to pass through.

The second coupler 3224 is configured to couple two radio frequency signals and to output the two radio frequency signals coupled. In one implementation, the second coupler 3224 further has a power distribution function, and is configured to distribute input signal power to corresponding receive ports of the radio frequency transceiver 31, thereby facilitating the radio frequency transceiver 31 to adjust the power of the radio frequency signals transmitted therefrom.

The second selector switch 3225 may be a single-pole double-throw (SPDT) switch. When the selector port of the second selector switch 3225 is coupled with the first fixed port of the second selector switch 3225, the second power amplifier 3221, the second filter 3223, and the second coupler 3224 of the second transceiver circuit 322 are operable to form a transmit path, and in this case, the second transceiver circuit 322 is configured to process uplink signals. When the selector port of the second selector switch 3225 is coupled with the second fixed port of the second selector switch 3225, the second low noise amplifier 3222, the second filter 3223, and the second coupler 3224 of the second transceiver circuit 322 are operable to form a receive path, and in this case, the second transceiver circuit 322 is configured to process downlink signals.

The specific structure of the transceiver circuit in FIG. 5 or FIG. 6 is only one possible example, and components of the circuit may be reduced or added according to actual needs.

FIG. 7 is a schematic structural diagram illustrating a receiver circuit according to an implementation of the disclosure. As illustrated in FIG. 7, the first receiver circuit 331 includes a first low noise amplifier 3311 operable at the first frequency band (NR Band Nx), a second low noise amplifier 3312 operable at the second frequency band (NR Band Ny), a first filter 3313 allowing the first frequency band (NR Band Nx) to pass through, a second filter 3314 allowing the second frequency band (NR Band Ny) to pass through, and a selector switch 3315. The selector switch 3315 has a selector port configured to be coupled with one corresponding T port of the three second T ports. The first filter 3313 has an input port coupled with a first fixed port of the selector switch 3315 and an output port coupled with an input port of the first low noise amplifier 3311. The second filter 3314 has an input port coupled with a second fixed port of the selector switch 3315 and an output port coupled with an input port of the second low noise amplifier 3312. The first low noise amplifier 3311 has an output port coupled with a corresponding receive port RX2_Nx of the radio frequency transceiver 31 supporting reception at the first frequency band, and the second low noise amplifier 3312 has an output port coupled with a corresponding receive port RX2_Ny of the radio frequency transceiver 31 supporting reception at the second frequency band.

In the implementations of the present disclosure, the first filter 3313 and the second filter 3314 may be band pass filters. The first filter 3313 may filter the radio frequency signals received at the second T port supporting reception at the first frequency band. The first filter 3313 allows only the radio frequency signals at the first frequency band to pass through. The second filter 3314 may filter the radio frequency signals received at the second T port supporting reception at the second frequency band. The second filter 3314 allows only the radio frequency signals at the second frequency band to pass through.

The first low noise amplifier 3311 is configured to amplify the radio frequency signals passing through the first filter 3313, and the second low noise amplifier 3312 is configured to amplify the radio frequency signals passing through the second filter 3314. The low noise amplifier can improve the signal-to-noise ratio of the radio frequency signals output.

The selector switch 3315 may be a single-pole double-throw (SPDT) switch. When the selector port of the selector switch 3315 is coupled with the first fixed port of the selector switch 3315, the first low noise amplifier 3311 and the first filter 3313 are operable to form a first receive path, and in this case, the first receiver circuit 331 is configured to process downlink signals at the first frequency band. When the selector port of the selector switch 3315 is coupled with the second fixed port of the selector switch 3315, the second low noise amplifier 3312 and the second filter 3314 are operable to form a second receive path, and in this case, the first receiver circuit 331 is configured to process downlink signals at the second frequency band.

The specific structure of the first receiver circuit 331 in FIG. 7 is only one possible example, and components of the circuit may be reduced or added according to actual needs.

The second receiver circuit 332 and the third receiver circuit 333 may be the same circuits as the first receiver circuit 331.

Figure 8:
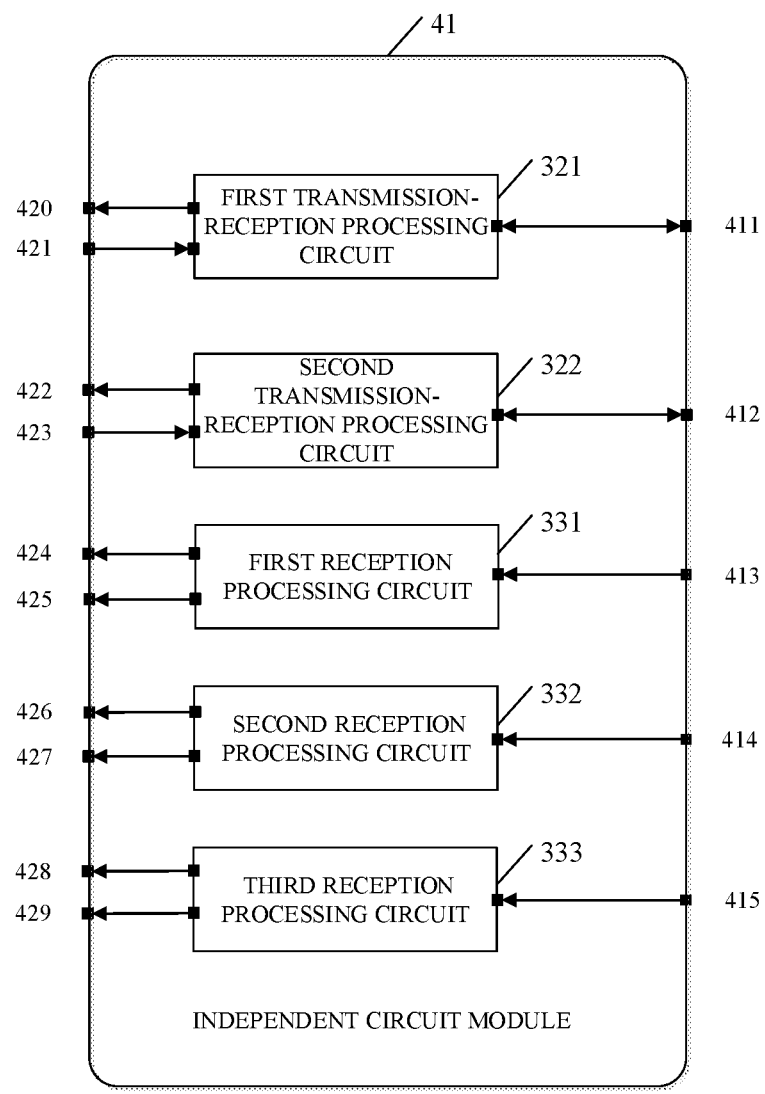
FIG. 8 is a schematic structural diagram illustrating a radio frequency circuit integrated in an independent circuit module according to an implementation of the disclosure.

In order to improve the integration of the radio frequency circuit, the first transceiver circuit 321, the second transceiver circuit 322, and the three receiver circuits in the radio frequency circuit 30 illustrated in FIG. 4 may be integrated in one independent circuit module. FIG. 8 is a schematic structural diagram illustrating a radio frequency circuit integrated in an independent circuit module according to an implementation of the disclosure. As illustrated in FIG. 8, the first transceiver circuit 321, the second transceiver circuit 322, the first receiver circuit 331, the second receiver circuit 332, and the third receiver circuit 333 are integrated in one independent circuit module 41. The independent circuit module 41 may include ten ports coupled with the radio frequency transceiver 31 (that is, ports 420, 421, 422, 423, 424, 425, 426, 427, 428, 429 as illustrated in FIG. 8), and five ports configured to be coupled with the multi-way switch 10 (that is, ports 411, 412, 413, 414, 415 as illustrated in FIG. 8). The ports 421, 423 are operable as the receive ports of the independent circuit module 41. The ports 422, 423, 424, 425, 426, 427, 428, 429 are operable as the transmit ports of the independent circuit module 41. The ports 411, 412 are operable as receive-transmit ports of the independent circuit module 41, and are configured to be respectively coupled with the two first T ports of the multi-way switch 10. The ports 413, 414, and 415 are the receive ports of the independent circuit module 41, and are configured to be coupled with the three second T ports of the multi-way switch 10 in one-to-one correspondence. As illustrated in FIG. 8, the number of ports of the independent circuit module 41 is equal to that of ports of all the signal processing circuits (that is, the first transceiver circuit 321, the second transceiver circuit 322, the first receiver circuit 331, the second receiver circuit 332, and the third receiver circuit 333) integrated in the independent circuit module 41, and the ports of the independent circuit module 41 and the ports of all the signal processing circuits integrated in the independent circuit module 41 are coupled correspondingly. In one implementation, the port 420 is coupled with the transmit port of the first transceiver circuit 321, the port 421 is coupled with the receive port of the first transceiver circuit 321, and the port 411 is coupled with the receive-transmit port of the first transceiver circuit 321. The port 422 is coupled with the transmit port of the second transceiver circuit 322, the port 423 is coupled with the receive port of the second transceiver circuit 322, and the port 412 is coupled with the receive-transmit port of the second transceiver circuit 322. The ports 424 and 425 are respectively coupled with the two receive ports of the first receiver circuit 331, and port 413 is coupled with the receive port of the first receiver circuit 331. The ports 426 and 427 are respectively coupled with the two receive ports of the second receiver circuit 332, and the port 414 is coupled with the receive port of the second receiver circuit 332. The ports 428 and 429 are respectively coupled with two receive ports of the third receiver circuit 333, and the port 415 is coupled with the receive port of the third receiver circuit 333.

In the implementations of the present disclosure, the first transceiver circuit 321, the second transceiver circuit 322, and the three receiver circuits are integrated into one independent circuit module, which can improve the integration of the radio frequency circuit, reduce the number of independent circuit modules, and improve the space utilization of the electronic device 100, thereby facilitating and improving adaptation flexibility and reducing costs.

In one implementation, the first transceiver circuit 321, the second transceiver circuit 322, and the three receiver circuits in the radio frequency circuit 30 illustrated in FIG. 4 are integrated in two independent circuit modules. The two independent circuit modules include a first independent circuit module and a second independent circuit module. The first independent circuit module includes at least the first transceiver circuit and the second transceiver circuit. The second independent circuit module includes at least two of the three receiver circuits.

Figure 9:
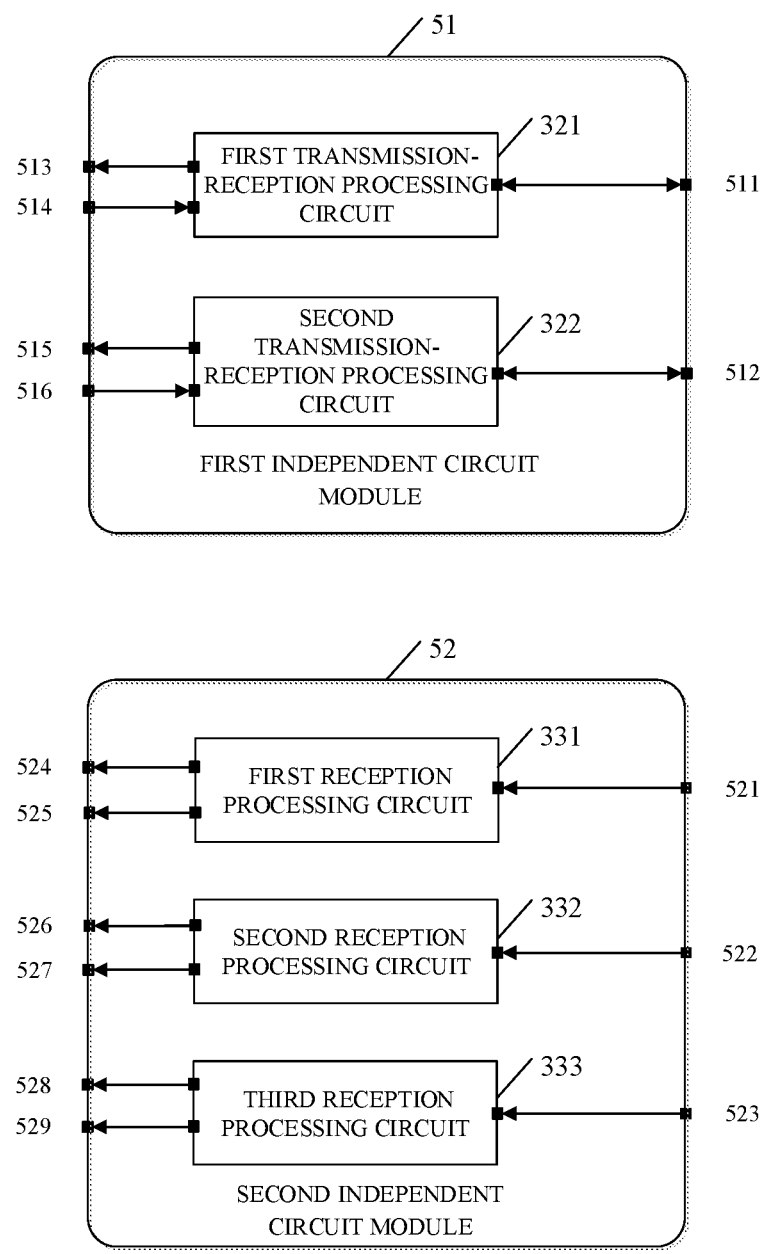
FIG. 9 is a schematic structural diagram illustrating another radio frequency circuit integrated in independent circuit modules according to an implementation of the disclosure.

FIG. 9 is a schematic structural diagram illustrating another radio frequency circuit integrated in independent circuit modules according to an implementation of the disclosure. As illustrated in FIG. 9, the first transceiver circuit 321 and the second transceiver circuit 322 are integrated in the first independent circuit module 51. The first receiver circuit 331, the second receiver circuit 332, and the third receiver circuit 333 are integrated in the second independent circuit module 52. The first independent circuit module 51 includes two receive ports (that is, ports 514, 516 as illustrated in FIG. 9), two transmit ports (that is, ports 513, 515 as illustrated in FIG. 9), and two receive-transmit ports (that is, ports 511, 512 as illustrated in FIG. 9). The ports 514, 516 are coupled with the transmit ports TX_Nx and TX_Ny of the radio frequency transceiver 31, the ports 513, 515 are coupled with the receive ports RX1_Nx and RX1_Ny of the radio frequency transceiver 31. The port 511 is configured to be coupled with the first T port of the multi-way switch 10 supporting transmission and reception at the first frequency band. The port 512 is configured to be coupled with the first T port of the multi-way switch 10 supporting transmission and reception at the second frequency band. The second independent circuit module 52 includes three receive ports (that is, ports 521, 522, 523) and six transmit ports (that is, ports 524, 525, 526, 527, 528, 529). The ports 521, 522, and 523 are configured to be coupled with the three second T ports of the multi-way switch 10 in one-to-one correspondence, and each of the ports 524, 525, 526, 527, 528, and 529 is respectively coupled with one corresponding P port of receive ports RX2_Nx, RX2_Ny, RX3_Nx, RX3_Ny, RX4_Nx, and RX4_Ny of the radio frequency transceiver 31. It should be noted that all ports of all independent circuit modules are disconnected from each other.

As illustrated in FIG. 9, the number of ports of the first independent circuit module 51 is equal to that of ports of all the transceiver circuits integrated in the first independent circuit module 51, and the ports of the first independent circuit module 51 and the ports of all the transceiver circuits integrated in the first independent circuit module 51 are coupled correspondingly. The number of ports of the second independent circuit module 52 is equal to that of ports of all the receiver circuits integrated in the second independent circuit module 52, and the ports of the second independent circuit module 52 and the ports of all the receiver circuits integrated in the second independent circuit module 52 are coupled correspondingly.

It should be noted that the integration manner illustrated in FIG. 9 is only one possible implementation manner. On the premise of that the first transceiver circuit 321, the second transceiver circuit 322, and the three receiver circuits are integrated in two independent circuit modules, any other integration manners in which the first independent circuit module includes at least the first transceiver circuit and the second transceiver circuit, and the second independent circuit module includes at least two of the three receiver circuits are available.

In the implementations of the present disclosure, the first transceiver circuit 321, the second transceiver circuit 322, and the three receiver circuits are integrated into two independent circuit module, which can improve the integration of the radio frequency circuit, reduce the number of independent circuit modules, and improve the space utilization of the electronic device 100, thereby facilitating and improving adaptation flexibility and reducing costs.

In one implementation, the first transceiver circuit 321, the second transceiver circuit 322, and the three receiver circuits are integrated in three independent circuit modules.

The three independent circuit modules include a first independent circuit module, a second independent circuit module, and a third independent circuit module. The first independent circuit module includes the first transceiver circuit, the second independent circuit module includes the second transceiver circuit, and the third independent circuit module includes the three receiver circuits.

Figure 10:
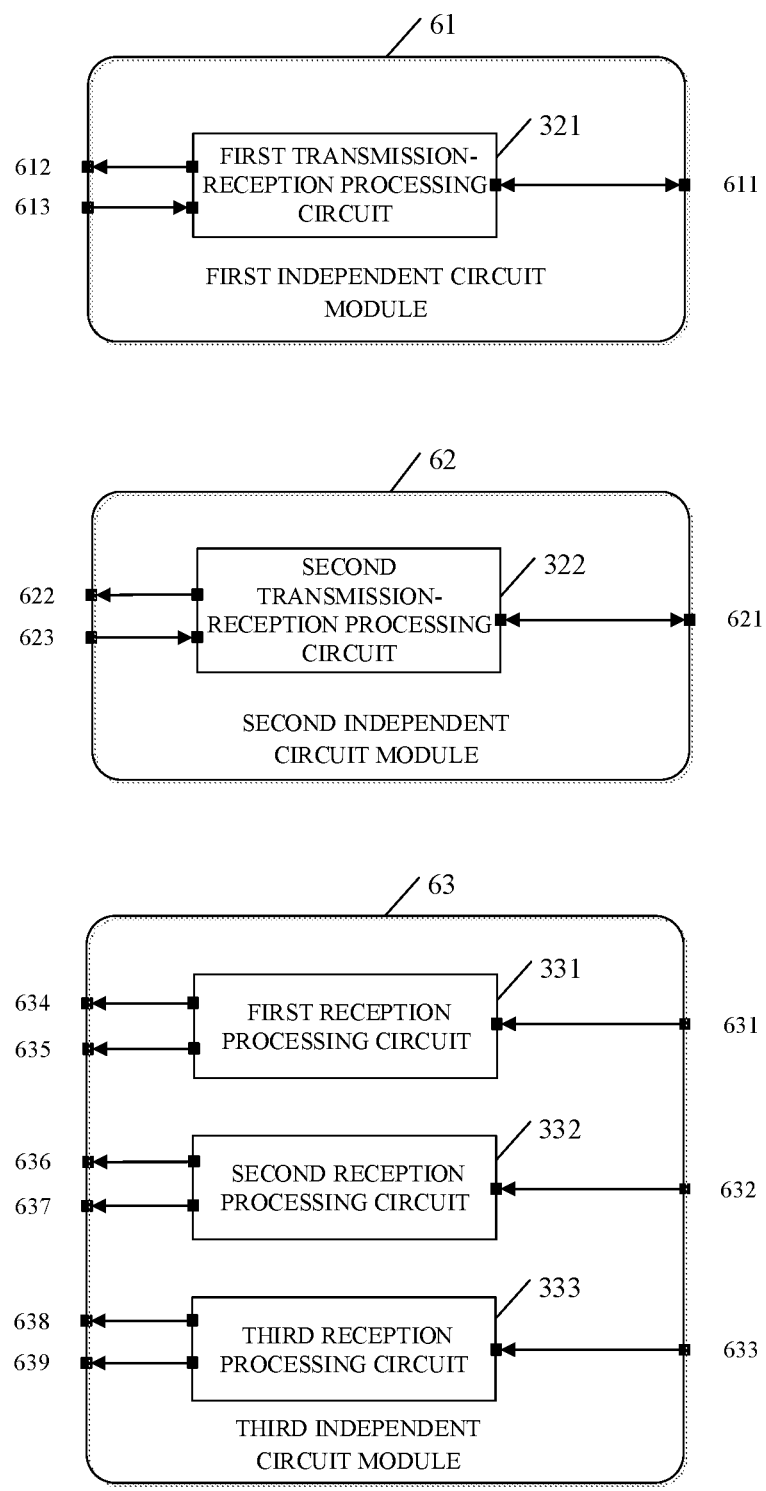
FIG. 10 is a schematic structural diagram illustrating yet another radio frequency circuit integrated in independent circuit modules according to an implementation of the disclosure.

FIG. 10 is a schematic structural diagram illustrating yet another radio frequency circuit integrated in independent circuit modules according to an implementation of the disclosure. As illustrated in FIG. 10, the first transceiver circuit 321 is integrated in the first independent circuit module 61, and the second transceiver circuit 322 is integrated in the second independent circuit module 62. The first receiver circuit 331, the second receiver circuit 332, and the third receiver circuit 333 are integrated in the third independent circuit module 63. The first independent circuit module 61 includes one receive port (that is, port 613 as illustrated in FIG. 10), one transmit port (that is, port 612 as illustrated in FIG. 10), and one receive-transmit port (that is, port 611 as illustrated in FIG. 10). The port 613 is coupled with a corresponding transmit port TX_Nx of the radio frequency transceiver 31, the port 612 is coupled with a corresponding receive port RX1_Nx of radio frequency transceiver 31, and the port 611 is configured to be coupled with the first T port of the multi-way switch 10 supporting transmission and reception at the first frequency band. The second independent circuit module 62 includes one receive port (that is, port 623 as illustrated in FIG. 10), one transmit port (that is, port 622 as illustrated in FIG. 10), and one receive-transmit port (that is, port 621 as illustrated in FIG. 10). The port 623 is coupled with a corresponding transmit port TX_Ny of the radio frequency transceiver 31, the port 622 is coupled with a corresponding receive port RX1_Ny of the radio frequency transceiver 31, and the port 621 is configured to be coupled with the first T port of the multi-way switch 10 supporting transmission and reception at the second frequency band. The third independent circuit module 63 includes three receive ports (that is, ports 631, 632, 633 as illustrated in FIG. 10) and six transmit ports (that is, ports 634, 635, 636, 637, 638, 639 as illustrated in FIG. 10). The ports 631, 632, and 633 are configured to be coupled with the three second T ports of the multi-way switch 10 in one-to-one correspondence, and each of the ports 634, 635, 636, 637, 638, and 639 is coupled with one corresponding receive port of ports RX2_Nx, RX2_Ny, RX3_Nx, RX3_Ny, RX4_Nx, RX4_Ny of the radio frequency transceiver 31. It should be noted that all ports of all independent circuit modules are disconnected from each other.

As illustrated in FIG. 10, the number of ports of the first independent circuit module 61 is equal to that of ports of the first transceiver circuit integrated in the first independent circuit module 61, and the ports of the first independent circuit module 61 and the ports of the first transceiver circuit integrated in the first independent circuit module 61 are coupled correspondingly. The number of ports of the second independent circuit module 62 is equal to that of ports of the second transceiver circuit integrated in the second independent circuit module 62, and the ports of the second independent circuit module 62 and the ports of the second transceiver circuit integrated in the second independent circuit module 62 are coupled correspondingly. The number of ports of the third independent circuit module 63 is equal to that of ports of all the receiver circuits integrated in the third independent circuit module 63, and the ports of the third independent circuit module 63 and the ports of all the receiver circuits integrated in the third independent circuit module 63 are coupled correspondingly.

In the implementations of the present disclosure, the first transceiver circuit 321, the second transceiver circuit 322, and the three receiver circuits are integrated into three independent circuit module, which can improve the integration of the radio frequency circuit, reduce the number of independent circuit modules, and improve the space utilization of the electronic device 100, thereby facilitating and improving adaptation flexibility and reducing costs.

In one implementation, the first transceiver circuit 321, the second transceiver circuit 322, and the three receiver circuits in the radio frequency circuit 30 illustrated in FIG. 4 are integrated in four independent circuit modules.

The four independent circuit modules include a first independent circuit module, a second independent circuit module, a third independent circuit module, and a fourth independent circuit module. The first independent circuit module includes the first transceiver circuit and the second transceiver circuit, the second independent circuit module, the third independent circuit module, and the fourth independent circuit module each include one of the three receiver circuits.

Figure 11:
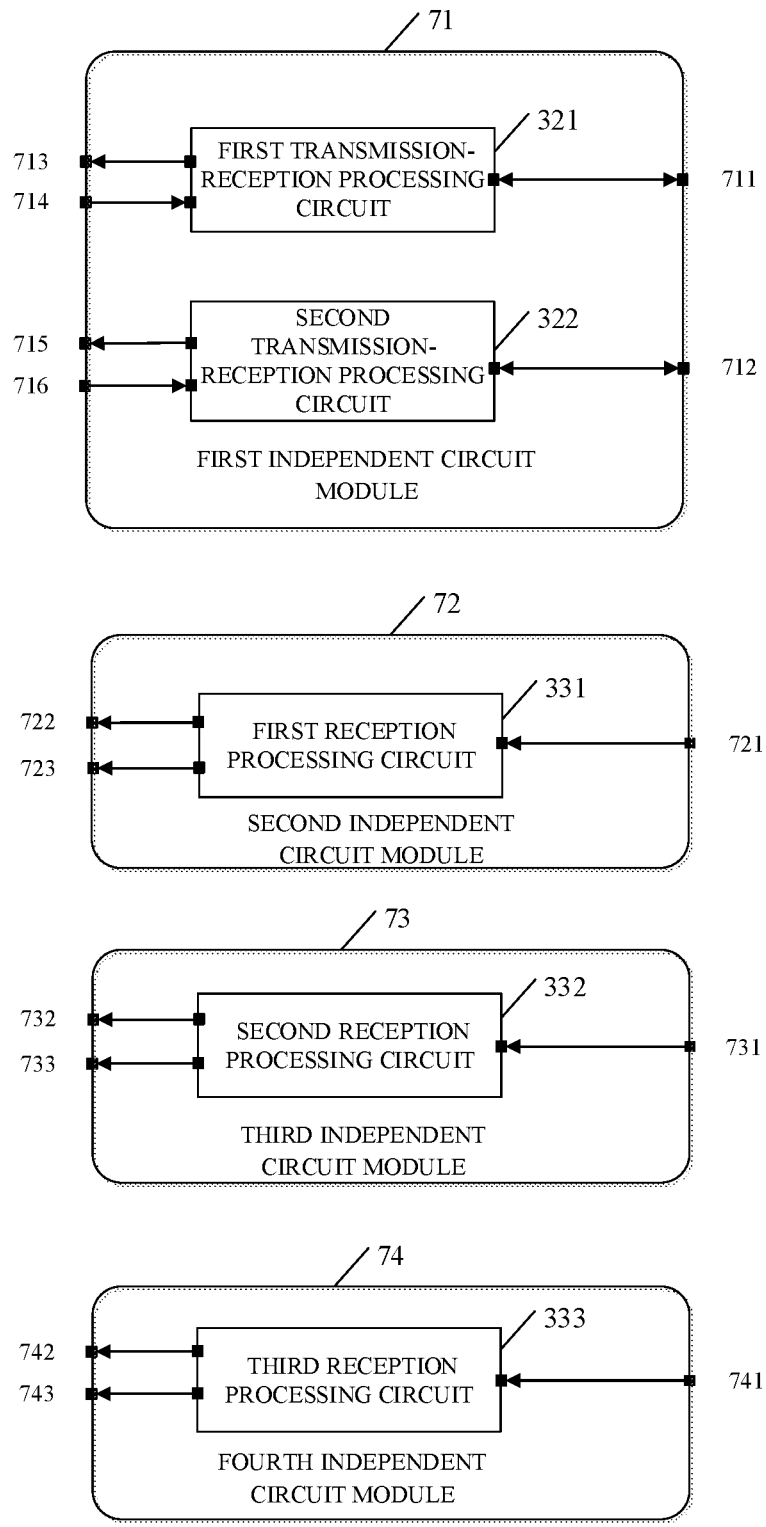
FIG. 11 is a schematic structural diagram illustrating still another radio frequency circuit integrated in independent circuit modules according to an implementation of the disclosure.

FIG. 11 is a schematic structural diagram illustrating still another radio frequency circuit integrated in independent circuit modules according to an implementation of the disclosure. As illustrated in FIG. 11, the first transceiver circuit 321 and the second transceiver circuit 322 are integrated in the first independent circuit module 71. The first receiver circuit 331 is integrated in the second independent circuit module 72. The second receiver circuit 332 is integrated in the third independent circuit module 73. The third receiver circuit 333 is integrated in the fourth independent circuit module 74. The first independent circuit module 71 includes two receive ports (that is, ports 714, 716 as illustrated in FIG. 11), two transmit ports (that is, ports 713, 715 as illustrated in FIG. 11), and two receive-transmit ports (that is, ports 711, 712 as illustrated in FIG. 11). The ports 714, 716 are coupled with corresponding transmit ports TX_Nx and TX_Ny of the radio frequency transceiver 31. The ports 713, 715 are coupled with corresponding receive ports RX1_Nx and RX1_Ny of the radio frequency transceiver 31. The port 711 is configured to be coupled with the first T port of the multi-way switch 10 supporting transmission and reception at the first frequency band. The port 712 is configured to be coupled with the first T port of the multi-way switch 10 supporting reception at the second frequency band. The second independent circuit module 72 includes two transmit ports (that is, ports 722, 723 as illustrated in FIG. 11) and one receive port (that is, port 721 as illustrated in FIG. 11). The port 721 is configured to be coupled with one corresponding T port of the three second T port of the multi-way switch 10. Each of the ports 722, 723 is respectively coupled with one corresponding receive port of receive ports RX2_Nx and RX2_Ny of the radio frequency transceiver 31. The third independent circuit module 73 includes two transmit ports (that is, ports 732, 733 as illustrated in FIG. 11) and one receive port (that is, port 731 as illustrated in FIG. 11). The port 731 is configured to be coupled with one corresponding T port of the three second T ports of the multi-way switch 10. Each of the ports 732, 733 is coupled with one corresponding receive port of receive ports RX3_Nx and RX3_Ny of the radio frequency transceiver 31. The fourth independent circuit module 74 includes two transmit ports (that is, ports 742, 743 as illustrated in FIG. 11) and one receive port (that is, port 741 as illustrated in FIG. 11). The port 741 is configured to be coupled with one corresponding T port of the three second T ports of the multi-way switch 10. Each of the ports 742, 743 is coupled with one corresponding receive port of receive ports RX4_Nx and RX4_Ny of the radio frequency transceiver 31. It should be noted that all ports of all independent circuit modules illustrated in FIG. 11 are disconnected from each other.

As illustrated in FIG. 11, the number of ports of the first independent circuit module 71 is equal to that of ports of all the transceiver circuits integrated in the first independent circuit module 71, and the ports of the first independent circuit module 71 and the ports of all the transceiver circuits integrated in the first independent circuit module 71 are coupled correspondingly. The number of ports of the second independent circuit module 72 is equal to that of ports of the first receiver circuit integrated in the second independent circuit module 72, and the ports of the second independent circuit module 72 and the ports of the first receiver circuit integrated in the second independent circuit module 72 are coupled correspondingly. The number of ports of the third independent circuit module 73 is equal to that of ports of the second receiver circuit integrated in the third independent circuit module 73, and the ports of the third independent circuit module 73 and the ports of the second receiver circuit integrated in the third independent circuit module 73 are coupled correspondingly. The number of ports of the fourth independent circuit module 74 is equal to that of ports of the third receiver circuit integrated in the fourth independent circuit module 74, and the ports of the fourth independent circuit module 74 and the ports of the third receiver circuit integrated in the fourth independent circuit module 74 are coupled correspondingly.

In the implementations of the present disclosure, the first transceiver circuit 321, the second transceiver circuit 322, and the three receiver circuits are integrated into four independent circuit modules. Among the four independent circuit modules, three independent circuit modules (that is, the second independent circuit module 72, the third independent circuit module 73, and the fourth independent circuit module 74 illustrated in FIG. 11) have the same circuit structure. The reusability of the independent circuit modules can be improved, thereby facilitating the mass production of the independent circuit modules, improving adaptation flexibility, and reducing cost.

In one implementation, the first transceiver circuit 321, the second transceiver circuit 322, and the three receiver circuits in the radio frequency circuit 30 illustrated in FIG. 4 are integrated in five independent circuit modules.

The five independent circuit modules include a first independent circuit module 81, a second independent circuit module 82, a third independent circuit module 83, a fourth independent circuit module 84, and a fifth independent circuit module 85. The first independent circuit module 81 includes the first transceiver circuit. The second independent circuit module 82 includes the second transceiver circuit. The third independent circuit module 83, the fourth independent circuit module 84, and the fifth independent circuit module 85 each include one of the three receiver circuits.

Figure 12:
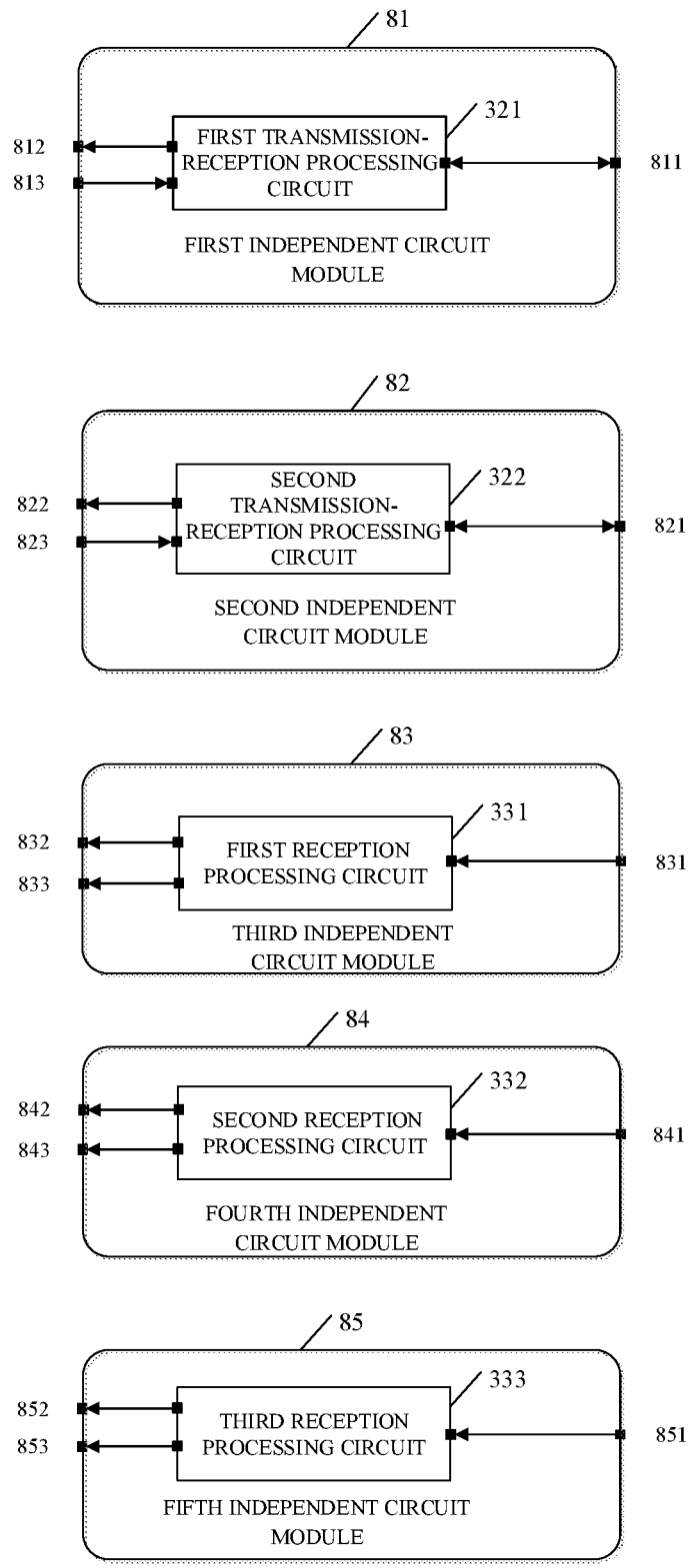
FIG. 12 is a schematic structural diagram illustrating still yet another radio frequency circuit integrated in independent circuit modules according to an implementation of the disclosure.

FIG. 12 is a schematic structural diagram illustrating still yet another radio frequency circuit integrated in independent circuit modules according to an implementation of the disclosure. As illustrated in FIG. 12, the first transceiver circuit 321 is integrated in the first independent circuit module 81. The second transceiver circuit 322 is integrated in the second independent circuit module 82. The first receiver circuit 331 is integrated in the third independent circuit module 83. The second receiver circuit 332 is integrated in the fourth independent circuit module 84. The third receiver circuit 333 is integrated in the fifth independent circuit module 85. The first independent circuit module 81 includes one receive port (that is, port 813 as illustrated in FIG. 12), a transmit port (that is, port 812 as illustrated in FIG. 12), and a receive-transmit port (that is, port 811 as illustrated in FIG. 12). The port 813 is coupled with a corresponding transmit port TX_Nx of the radio frequency transceiver 31. The port 812 is coupled with a corresponding transmit port RX1_Nx of the radio frequency transceiver 31. The port 811 is configured to be coupled with the first T port of the multi-way switch 10 supporting transmission and reception at the first frequency band. The second independent circuit module 82 includes a receive port (that is, port 823 as illustrated in FIG. 12), a transmit port (that is, port 822 as illustrated in FIG. 12), and a receive-transmit port (that is, port 821 as illustrated in FIG. 12). The port 823 is coupled with a corresponding transmit port TX_Ny of the radio frequency transceiver 31. The port 822 is coupled with a corresponding receive port RX1_Ny of the radio frequency transceiver 31. The port 821 is configured to be coupled with the first T port of the multi-way switch 10 supporting transmission and reception at the second frequency band.

The third independent circuit module 83 includes two transmit ports (that is, ports 832, 833 as illustrated in FIG. 12) and one receive port (that is, port 831 as illustrated in FIG. 12). The port 831 is configured to be coupled with one corresponding T port of the three second T ports of the multi-way switch 10. Each of the ports 832, 833 is coupled with one corresponding receive port of receive ports RX2_Nx and RX2_Ny of the radio frequency transceiver 31. The fourth independent circuit module 84 includes two transmit ports (that is, ports 842, 843 as illustrated in FIG. 12) and one receive port (that is, port 841 as illustrated in FIG. 12). The port 841 is configured to be coupled with one corresponding T port of the three second T ports of the multi-way switch 10. Each of the ports 842, 843 is coupled with one corresponding receive port of receive ports RX3_Nx and RX3_Ny of the radio frequency transceiver 31. The fifth independent circuit module 85 includes two transmit ports (that is, ports 852, 853 as illustrated in FIG. 12) and one receive port (that is, port 851 as illustrated in FIG. 12). The port 851 is configured to be coupled with one corresponding T port of the three second T ports of the multi-way switch 10. Each of the ports 852 and 853 is coupled with one corresponding receive port of receive ports RX4_Nx and RX4_Ny of the radio frequency transceiver 31. It should be noted that all ports of all independent circuit modules are disconnected from each other.

As illustrated in FIG. 12, the number of ports of the first independent circuit module 81 is equal to that of ports of the first transceiver circuit integrated in the first independent circuit module 81, and the ports of the first independent circuit module 81 and the ports of the first transceiver circuit integrated in the first independent circuit module 81 are coupled correspondingly. The number of ports of the second independent circuit module 82 is equal to that of ports of the second transceiver circuit integrated in the second independent circuit module 82, and the ports of the second independent circuit module 82 and the ports of the second transceiver circuit integrated in the second independent circuit module 82 are coupled correspondingly. The number of ports of the third independent circuit module 83 is equal to that of ports of the first receiver circuit integrated in the third independent circuit module 83, and the ports of the third independent circuit module 83 and the ports of the first receiver circuit integrated in the third independent circuit module 83 are coupled correspondingly. The number of ports of the fourth independent circuit module 84 is equal to that of ports of the second receiver circuit integrated in the fourth independent circuit module 84, and the ports of the fourth independent circuit module 84 and the ports of the second receiver circuit integrated in the fourth independent circuit module 84 are coupled correspondingly. The number of ports of the fifth independent circuit module 85 is equal to that of ports of the third receiver circuit integrated in the fifth independent circuit module 85, and the ports of the fifth independent circuit module 85 and the ports of the third receiver circuit integrated in the fifth independent circuit module 85 are coupled correspondingly.

In the implementations of the present disclosure, the first transceiver circuit 321, the second transceiver circuit 322, and the three receiver circuits are integrated into five independent circuit modules. Among the five independent circuit modules, three independent circuit modules (that is, the third independent circuit module 83, the fourth independent circuit module 84, and fifth independent circuit module 85 as illustrated in FIG. 12) have the same circuit structure. The reusability of the independent circuit modules can be improved, thereby facilitating the mass production of the independent circuit modules, improving adaptation flexibility, and reducing cost.

In one possible implementation, the four antennas include a first antenna, a second antenna, a third antenna, and a fourth antenna. These four antennas are all operable at a fifth generation new radio (5G NR) frequency band.

The 5G NR frequency band may include, for example, 3.3 GHz to 3.8 GHz and 4.4 GHz to 5 GHz.

In one possible implementation, the four antennas include a first antenna, a second antenna, a third antenna, and a fourth antenna. The first antenna and the fourth antenna are antennas operable at a long term evolution (LTE) frequency band and a fifth generation new radio (5G NR) frequency band. The second antenna and the third antenna are antennas only operable at the 5G NR frequency band.

The first antenna and fourth antenna are intended to support DL 4×4 MIMO for some frequency bands in LTE on terminals. These two antennas are shared with the 5G NR (hereinafter, "shared antennas" for short). The LTE frequency band may include, for example, 1880 MHz-1920 MHz and 2496 MHz-2690 MHz.

Figure 13:
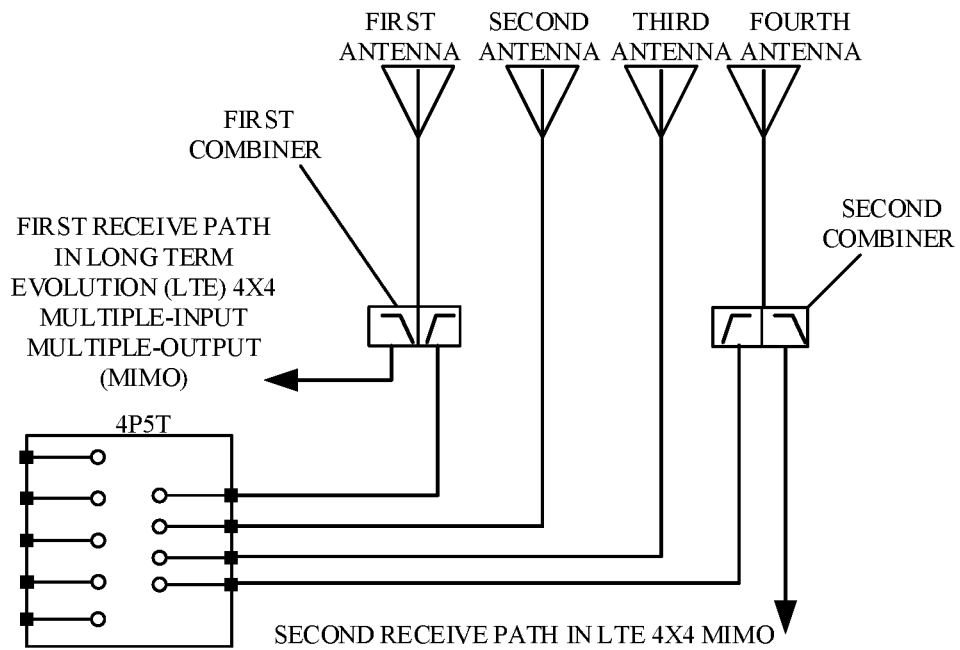
FIG. 13 is a schematic structural diagram illustrating an antenna system of an electronic device according to an implementation of the disclosure.

In one possible implementation, as illustrated in FIG. 13, the antenna system 20 further includes a first combiner and a second combiner. The first combiner has a first port configured to be coupled with the first antenna, a second port configured to be coupled with a first receive path in LTE 4×4 multiple-input multiple-output (MIMO) configuration of the electronic device, and a third port configured to be coupled with a corresponding P port of the multi-way switch. The second combiner has a first port configured to be coupled with the fourth antenna, a second port configured to be coupled with a second receive path in the LTE 4×4 MIMO configuration of the electronic device, and a third port configured to be coupled with a corresponding P port of the multi-way switch.

The LTE 4*4 MIMO is a downlink LTE receive circuit and can be defined as a third receive path. Since the LTE currently has two receive paths, in order to support LTE 4×4 MIMO, the third path and a fourth receive path are added.

According to performance of the four antennas, the electronic device will arrange one antenna with better performance for the circuit for PRX (primary receiver), and the antenna will in a standby state. Moreover, first T ports in the switch having both the transmission function and the reception function can be configured for TX (transmit) and PRX purpose, and thus the antenna can be switched arbitrarily. In this way, there is no need to restrict the coupling between ports of shared antennas.

Figure 14:
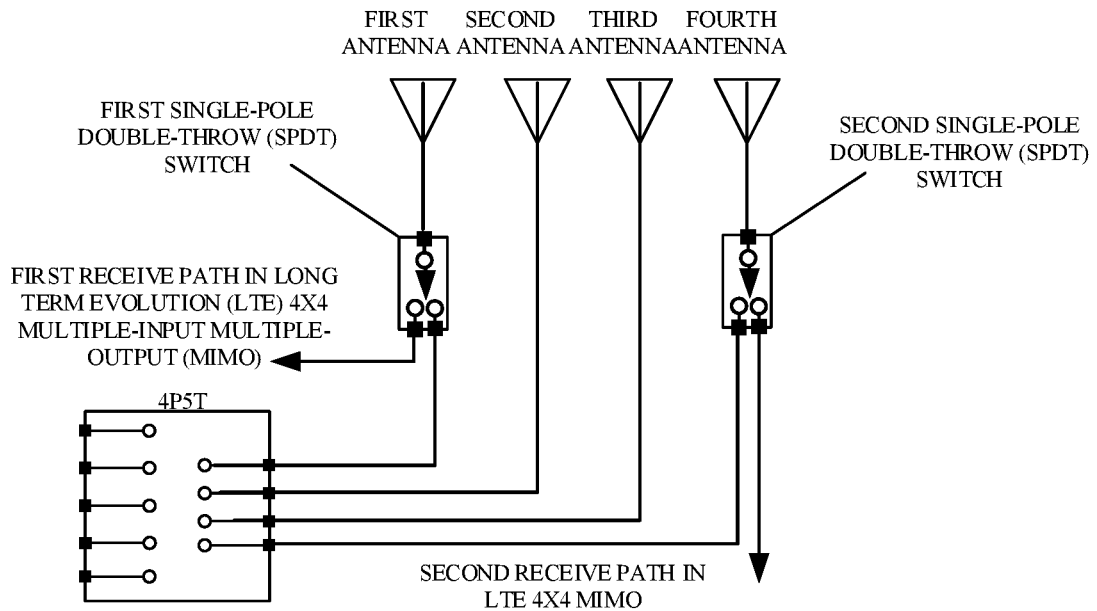
FIG. 14 is a schematic structural diagram illustrating another antenna system of an electronic device according to an implementation of the disclosure.

In one possible implementation, as illustrated in FIG. 14, the antenna system 20 further includes a first single-pole double-throw (SPDT) switch and a second SPDT switch. The first SPDT switch has a first port configured to be coupled with the first antenna, a second port configured to be coupled with a first receive path in LTE 4×4 multiple-input multiple-output (MIMO) configuration of the electronic device, and a third port configured to be coupled with a corresponding P port of the multi-way switch. The second SPDT switch has a first port configured to be coupled with the fourth antenna, a second port configured to be coupled with a second receive path in the LTE 4×4 MIMO configuration of the electronic device, and a third port configured to be coupled with a corresponding P port of the multi-way switch.

It should be noted that, some or all of the accompanying details of technical features of the multi-way switches provided by the above-identified implementations, can be used to or incorporate into a radio frequency system. The radio frequency system may further include an antenna system and a radio frequency circuit, and the multi-way switch may be coupled with the radio frequency circuit and the antenna system.

Figure 15:
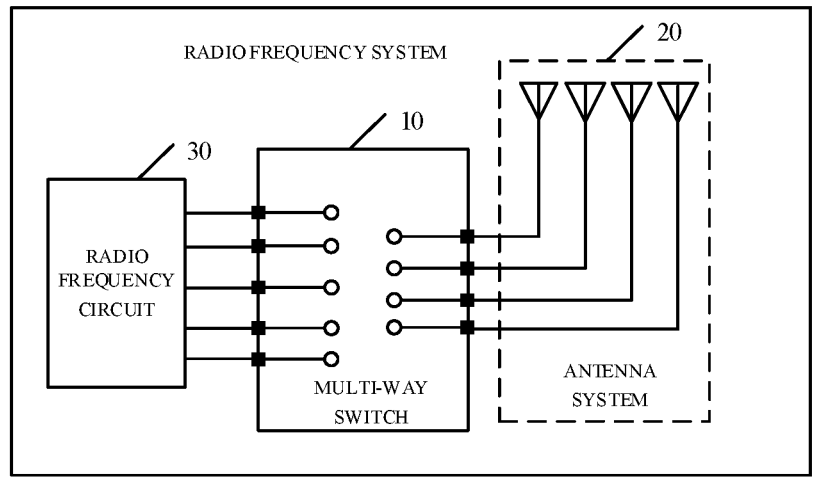
FIG. 15 is a schematic structural diagram illustrating a radio frequency system according to an implementation of the disclosure.

FIG. 15 is a schematic structural diagram illustrating a radio frequency system according to an implementation of the disclosure. The radio frequency system includes an antenna system 20, a radio frequency circuit 30, and the multi-way switch 10 according to any of the implementations above.

The multi-way switch 10 is coupled with the radio frequency circuit 30 and the antenna system 20 to implement a preset function of the electronic device 100, and the preset function is a function of transmitting the SRS through the four antennas corresponding to the four P ports in turn.

Figure 16:
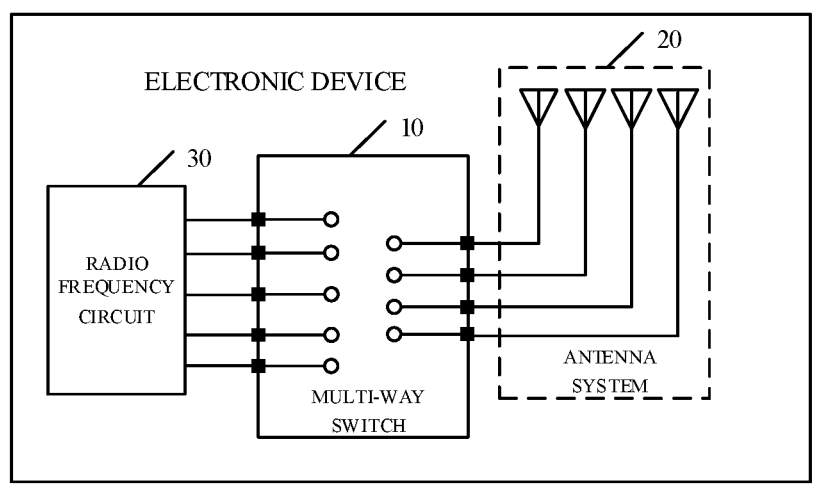
FIG. 16 is a schematic structural diagram illustrating an electronic device according to an implementation of the disclosure.

FIG. 16 is a schematic structural diagram illustrating an electronic device according to an implementation of the disclosure. The electronic device 100 includes an antenna system 20, a radio frequency circuit 30, and the multi-way switch described in any of the implementations above.

The multi-way switch 10 is coupled with the radio frequency circuit 30 and the antenna system 20 to implement a preset function of the electronic device 100, and the preset function is a function of transmitting the SRS through the four antennas corresponding to the four P ports in turn.

Figure 17:
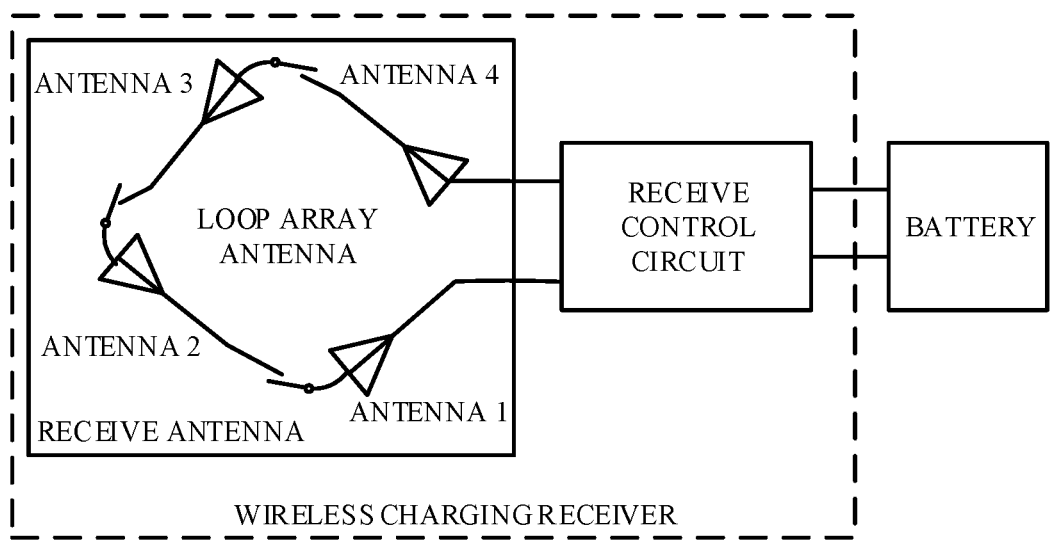
FIG. 17 is a schematic diagram illustrating a wireless charging receiver for multiplexing antennas of a wireless communication device according to an implementation of the disclosure.

In addition, as illustrated in FIG. 17, the four antennas in the antenna system 20 described in the implementations of the disclosure can also be multiplexed by a wireless charging receiver of the electronic device. The wireless charging receiver includes a receive antenna and a receive control circuit. The receive antenna matches transmit antennas of a wireless charging transmitter (resonates at the same or similar frequency and transfers energy in a wireless manner in the way of radiative resonant magnetic coupling). The receive control circuit converts, through a loop array antenna, the energy into a direct current (DC) to output to charge a battery. The receive control circuit can dynamically adjust a frequency of the loop array antenna and match the frequency of the loop array antenna with frequencies of the transmit antennas of the wireless charging transmitter to achieve paired charging. Alternatively, the receive control circuit interacts with the wireless charging transmitter in real time on a frequency change range to implement an "exclusive encryption" wireless charging mode.

The receive antenna may be an antenna include at least one of the four antennas (in the case of multiple antennas, the multiple antennas are strobed via switches).

Figure 18:
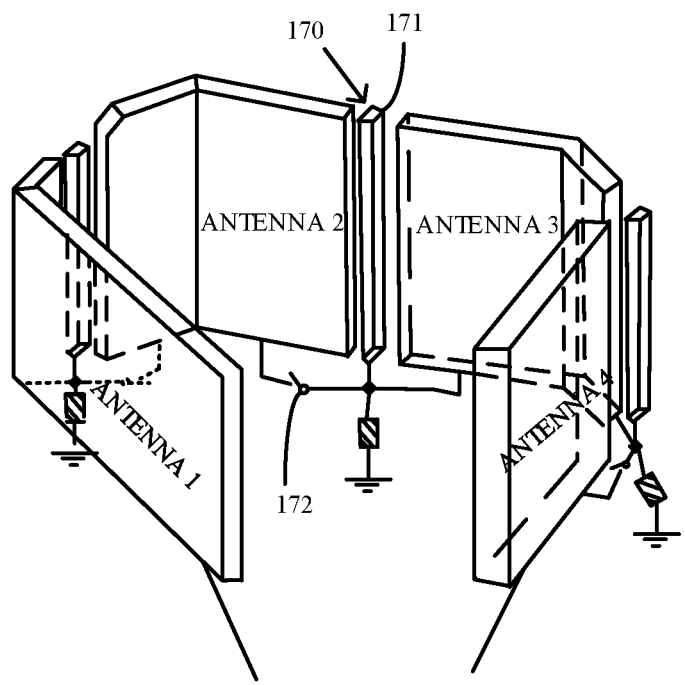
FIG. 18 is a schematic structural diagram illustrating a loop array antenna including four antennas according to an implementation of the disclosure.

For example, as illustrated in FIG. 18, the receive antenna is a loop array antenna including the four antennas described above. The four antennas include antenna 1, antenna 2, antenna 3, and antenna 4. Antenna 1 and antenna 4 are operable at both a LTE frequency band and a 5G NR frequency band, while antenna 2 and antenna 3 are only operable at the 5G NR frequency band. A port of antenna 1 and a port of antenna 4 are used as ports of the loop array antenna. Adjacent antennas are coupled via a gate circuit 170 with an isolation function. The gate circuit 170 includes a spacer 171 and a switch 172, where the spacer 171 is a conductor and the switch 172 is further coupled with a controller. The electronic device can conduct the switch 172 of each gate circuit 170 in a wireless charging mode to form a loop array antenna to receive energy. By adding the spacers 171 among the antennas, the gate circuit 170 can reduce mutual coupling among the multiple antennas of the electronic device in a normal communication mode, improve isolation among the multiple antennas, and optimize performance of the antennas. On the other hand, the multiple antennas can be coupled in series to form the loop array antenna through the switches 172, so as to better match the transmit antennas to transfer energy. Furthermore, since antenna 1 and antenna 4 have capabilities stronger than that of antenna 2 and antenna 3, the loop array antenna thus arranged can reduce energy loss in transmission as much as possible. Specifically, as illustrated in FIG. 18, antenna 1 and antenna 4 are not disposed adjacently. Compared with disposing antenna 1 and antenna 4 adjacently, not disposing antenna 1 and antenna 4 adjacently has the following advantages. When antenna 1 and antenna 4 are disposed adjacently, since both antenna 1 and antenna 4 are operable at the LTE frequency band and the 5G frequency band, overlap in frequency between antenna 1 and antenna 4 will be great, which will increase mutual coupling between antenna 1 and antenna 4 and in turn increase difficulty in matching impedance of antenna 1 with impedance of antenna 4, thereby resulting in increase in energy loss in transmission. In addition, influence of disposing antenna 1 and antenna 4 adjacently is substantially greater than that of disposing antenna 2 and antenna 3 adjacently, and advantages of not disposing antenna 1 and antenna 4 adjacently are substantially greater than those of not disposing antenna 2 and antenna 3 adjacently. Therefore, configuration illustrated in FIG. 18 will certainly cause stronger capabilities (energy-transmission efficiency) of antenna 1 and antenna 4 than those of antenna 2 and antenna 3, thereby improving transmission performance.

While the disclosure has been described in connection with certain implementations, it is to be pointed out that the disclosure is not to be limited to the disclosed implementations but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A multi-way switch, comprising:
    five T ports and four P ports, and the five T ports comprising two first T ports coupled with all of the four P ports;
    the multi-way switch being configured to be coupled with a radio frequency circuit and an antenna system of a wireless communication device;
    the wireless communication device operable in a dual-frequency single-transmit mode; and
    the antenna system comprising four antennas corresponding to the four P ports;
    wherein the five T ports further comprise three second T ports, each of the three second T ports is coupled with one corresponding P port of the four P ports, and the three second T ports support reception at a first frequency band and a second frequency band, wherein the first frequency band does not overlap with the second frequency band;
    the three second T ports are coupled with different P ports;
    the four P ports are configured to be coupled in one-to-one correspondence with the four antennas;
    the two first T ports comprise one first T port supporting transmission and reception at the first frequency band and the other first T port supporting transmission and reception at the second frequency band.

2. The multi-way switch of claim 1, wherein
    the radio frequency circuit comprises a radio frequency transceiver, a first transceiver circuit, a second transceiver circuit, and three receiver circuits;
    the first transceiver circuit comprises a transmit path supporting transmission at the first frequency band and a receive path supporting reception at the first frequency band and coupled with the transmit path supporting transmission at the first frequency band;
    the second transceiver circuit comprises a transmit path supporting transmission at the second frequency band and a receive path supporting reception at the second frequency band and coupled with the transmit path supporting transmission at the second frequency band; and
    each receiver circuit comprises a first receive path supporting transmission at the first frequency band and a second receive path supporting reception at the second frequency band and coupled with the first receive path.

3. The multi-way switch of claim 2, wherein the first transceiver circuit, the second transceiver circuit, and the three receiver circuits are integrated in one independent circuit module.

4. The multi-way switch of claim 2, wherein
    the first transceiver circuit, the second transceiver circuit, and the three receiver circuits are integrated in two independent circuit modules; and
    the two independent circuit modules comprise a first independent circuit module and a second independent circuit module, the first independent circuit module comprises at least the first transceiver circuit and the second transceiver circuit, and the second independent circuit module comprises at least two of the three receiver circuits.

5. The multi-way switch of claim 2, wherein
    the first transceiver circuit, the second transceiver circuit, and the three receiver circuits are integrated in three independent circuit modules;
    the three independent circuit modules comprise a first independent circuit module, a second independent circuit module, and a third independent circuit module; and
    the first independent circuit module comprises the first transceiver circuit, the second independent circuit module comprises the second transceiver circuit, and the third independent circuit module comprises the three receiver circuits.

6. The multi-way switch of claim 2, wherein
    the first transceiver circuit, the second transceiver circuit, and the three receiver circuits are integrated in four independent circuit modules;
    the four independent circuit modules comprise a first independent circuit module, a second independent circuit module, a third independent circuit module, and a fourth independent circuit module; and
    the first independent circuit module comprises the first transceiver circuit and the second transceiver circuit, the second independent circuit module, the third independent circuit module, and the fourth independent circuit module each comprise one of the three receiver circuits.

7. The multi-way switch of claim 2, wherein
    the first transceiver circuit, the second transceiver circuit, and the three receiver circuits are integrated in five independent circuit modules;
    the five independent circuit modules comprise a first independent circuit module, a second independent circuit module, a third independent circuit module, a fourth independent circuit module, and a fifth independent circuit module; and
    the first independent circuit module comprises the first transceiver circuit, the second independent circuit module comprises the second transceiver circuit, and the third independent circuit module, the fourth independent circuit module, and the fifth independent circuit module each comprise one of the three receiver circuits.

8. The multi-way switch of claim 2, wherein
    the first transceiver circuit comprises a first power amplifier operable at the first frequency band, a first low noise amplifier operable at the first frequency band, a first filter allowing the first frequency band to pass through, a first coupler, and a first selector switch;
    the first power amplifier has an input port coupled with a corresponding transmit port of the radio frequency transceiver and an output port coupled with a first fixed port of the first selector switch;

the first low noise amplifier has an output port coupled with a corresponding receive port of the radio frequency transceiver and an input port coupled with a second fixed port of the first selector switch;

the first filter has a first port coupled with a selector port of the first selector switch and a second port coupled with a first port of the first coupler; and the first coupler has a second port configured to be coupled with the first T port supporting transmission and reception at the first frequency band.

9. The multi-way switch of claim 2, wherein the second transceiver circuit comprises a second power amplifier operable at the second frequency band, a second low noise amplifier operable at the second frequency band, a second filter allowing the second frequency band to pass through, a second coupler, and a second selector switch;

the second power amplifier has an input port coupled with a corresponding transmit port of the radio frequency transceiver and an output port coupled with a first fixed port of the second selector switch;

the second low noise amplifier has an output port coupled with a corresponding receive port of the radio frequency transceiver and an input port coupled with a second fixed port of the second selector switch;

the second filter has a first port coupled with a selector port of the second selector switch and a second port coupled with a first port of the second coupler; and the second coupler has a second port configured to be coupled with the first T port supporting transmission and reception at the second frequency band.

10. The multi-way switch of claim 2, wherein each receiver circuit comprises a first low noise amplifier operable at the first frequency band, a second low noise amplifier operable at the second frequency band, a first filter allowing the first frequency band to pass through, a second filter allowing the second frequency band to pass through, and a selector switch;

the selector switch has a selector port configured to be coupled with one corresponding T port of the three second T ports;

the first filter has an input port coupled with a first fixed port of the selector switch and an output port coupled with an input port of the first low noise amplifier;

the second filter has an input port coupled with a second fixed port of the selector switch and an output port coupled with an input port of the second low noise amplifier; and the first low noise amplifier has an output port coupled with a corresponding receive port of the radio frequency transceiver supporting reception at the first frequency band, and the second low noise amplifier has an output port coupled with a corresponding receive port of the radio frequency transceiver supporting reception at the second frequency band.

11. The multi-way switch of claim 1, wherein the multi-way switch is configured to be coupled with the radio frequency circuit and the antenna system of the wireless communication device to implement a preset function of the wireless communication device, and the preset function is a function of transmitting a sounding reference signal (SRS) through the four antennas in turn.

12. The multi-way switch of claim 1, wherein the four antennas comprise a first antenna, a second antenna, a third antenna, and a fourth antenna; and the first antenna, the second antenna, the third antenna, and the fourth antenna are antennas operable at a fifth generation new radio (5G NR) frequency band.

13. The multi-way switch of claim 1, wherein the four antennas comprise a first antenna, a second antenna, a third antenna, and a fourth antenna;

the first antenna and the fourth antenna are antennas operable at a long term evolution (LTE) frequency band and a 5G NR frequency band; and the second antenna and the third antenna are antennas only operable at the 5G NR frequency band.

14. The multi-way switch of claim 13, wherein the antenna system further comprises a first combiner and a second combiner, wherein the first combiner has a first port coupled with the first antenna, a second port configured to be coupled with a first receive path in LTE 4×4 multiple-input multiple-output (MIMO) configuration of the wireless communication device, and a third port configured to be coupled with a corresponding P port of the multi-way switch; and the second combiner has a first port coupled with the fourth antenna, a second port configured to be coupled with a second receive path in the LTE 4×4 MIMO configuration of the wireless communication device, and a third port configured to be coupled with a corresponding P port of the multi-way switch.

15. The multi-way switch of claim 13, wherein the antenna system further comprises a first single-pole double-throw (SPDT) switch and a second SPDT switch, wherein the first SPDT switch has a first port coupled with the first antenna, a second port configured to be coupled with a first receive path in LTE 4×4 multiple-input multiple-output (MIMO) configuration of the wireless communication device, and a third port configured to be coupled with a corresponding P port of the multi-way switch; and the second SPDT switch has a first port coupled with the fourth antenna, a second port configured to be coupled with a second receive path in the LTE 4×4 MIMO configuration of the wireless communication device, and a third port configured to be coupled with a corresponding P port of the multi-way switch.

16. A radio frequency system, comprising an antenna system, a radio frequency circuit, and a multi-way switch coupled with the radio frequency circuit and the antenna system of a wireless communication device;

the multi-way switch comprising five T ports and four P ports, and the five T ports comprising two first T ports and three second T ports, each first T port being coupled with all of the four P ports and each second T port being coupled with one corresponding P port of the four P ports;

the wireless communication device operable in a dual-frequency single-transmit mode;

the antenna system comprising four antennas corresponding to the four P ports; and the multi-way switch being configured to implement a preset function of transmitting the SRS through the four antennas in turn;

wherein the three second T ports support reception at a first frequency band and a second frequency band, wherein the first frequency band does not overlap with the second frequency band;

the three second T ports are coupled with different P ports;

the four P ports are coupled in one-to-one correspondence with the four antennas; and the two first T ports comprise one first T port supporting transmission and reception at the first frequency band and the other first T port supporting transmission and reception at the second frequency band.

17. A wireless communication device, comprising an antenna system, a radio frequency transmitter, a radio frequency circuit coupled with the radio frequency transmitter, and a multi-way switch coupled with the radio frequency circuit and the antenna system;

the multi-way switch comprising five T ports and four P ports, and the five T ports comprising two first T ports coupled with all of the four P ports;

the wireless communication device operable in a dual-frequency single-transmit mode;

the antenna system comprising four antennas corresponding to the four P ports; and the multi-way switch being configured to implement a preset function of transmitting the SRS through the four antennas in turn;

wherein the five T ports further comprise three second T ports, each of the three second T ports is coupled with one corresponding P port of the four P ports, and the three second T ports support reception at a first frequency band and a second frequency band, wherein the first frequency band does not overlap with the second frequency band;

the three second T ports are coupled with different P ports;

the four P ports are coupled in one-to-one correspondence with the four antennas; and the two first T ports comprise one first T port supporting transmission and reception at the first frequency band and the other first T port supporting transmission and reception at the second frequency band.

* * * * *